United States Patent
Furukawa et al.

(10) Patent No.: US 7,786,725 B2
(45) Date of Patent: Aug. 31, 2010

(54) MAGNETIC FIELD DETECTION APPARATUS FOR DETECTING AN EXTERNAL MAGNETIC FIELD APPLIED TO A MAGNETORESISTANCE EFFECT ELEMENT, AND METHOD OF ADJUSTING THE SAME

(75) Inventors: Taisuke Furukawa, Tokyo (JP); Hiroshi Kobayashi, Tokyo (JP); Takashi Takenaga, Tokyo (JP); Takeharu Kuroiwa, Tokyo (JP); Sadeh Beysen, Tokyo (JP); Masakazu Taki, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 894 days.

(21) Appl. No.: 11/509,609

(22) Filed: Aug. 25, 2006

(65) Prior Publication Data

US 2007/0047152 A1 Mar. 1, 2007

(30) Foreign Application Priority Data

Aug. 31, 2005 (JP) ............................. 2005-251787

(51) Int. Cl.
*G01B 7/30* (2006.01)
(52) U.S. Cl. .................................. 324/207.21; 324/252
(58) Field of Classification Search ............ 324/207.21, 324/252
See application file for complete search history.

(56) References Cited

U.S. PATENT DOCUMENTS

| | | | | |
|---|---|---|---|---|
| 4,401,944 A * | 8/1983 | Narimatsu et al. | ...... | 324/207.21 |
| 4,949,039 A * | 8/1990 | Grunberg | .................... | 324/252 |
| 5,828,529 A * | 10/1998 | Gill | ........................ | 360/324.11 |
| 6,052,263 A * | 4/2000 | Gill | ........................ | 360/324.11 |
| 6,211,669 B1 * | 4/2001 | Yokotani et al. | ....... | 324/207.21 |
| 6,562,486 B2 * | 5/2003 | Sakakima et al. | ........... | 428/811 |
| 6,646,834 B2 * | 11/2003 | Sano et al. | ............. | 360/324.11 |
| 6,882,145 B2 | 4/2005 | Ehresmann et al. | | |
| 2003/0137381 A1 | 7/2003 | Toyoda et al. | | |

(Continued)

FOREIGN PATENT DOCUMENTS

JP 51-087449 1/1975

(Continued)

OTHER PUBLICATIONS

U.S. Appl. No. 12/098,291, filed Apr. 4, 2008, Takenaga, et al.

(Continued)

*Primary Examiner*—Jay M Patidar
(74) *Attorney, Agent, or Firm*—Oblon, Spivak, McClelland, Maier & Neustadt, L.L.P.

(57) ABSTRACT

A magnetic field detection apparatus capable of changing the detection range and detection sensitivity as desired for a specific application is disclosed. A magnetoresistance effect element is applied a bias magnetic field and an external magnetic field. The bias magnetic field and the external magnetic field are generated on the same straight line, and therefore the bias magnetic field functions to hamper the external magnetic field applied to the magnetoresistance effect element. Thus, the magnetization of the free layer of the magnetoresistance effect element is suppressed, and the rotational angle of the magnetized vector is reduced. As a result, the characteristic of the resistance value of the magnetoresistance effect element to the external magnetic field is shifted by an amount equivalent to the bias magnetic field.

6 Claims, 34 Drawing Sheets

U.S. PATENT DOCUMENTS

2003/0173955 A1 9/2003 Uenoyama

FOREIGN PATENT DOCUMENTS

| JP | 02-246176 | 10/1990 |
|---|---|---|
| JP | 4-358310 | 12/1992 |
| JP | 06-148301 | 5/1994 |
| JP | 06-180305 | 6/1994 |
| JP | 08-201492 | 8/1996 |
| JP | 8-226960 | 9/1996 |
| JP | 11-101861 | 4/1999 |
| JP | 11-298063 | 10/1999 |
| JP | 2001-217478 | 8/2001 |
| JP | 2002-092829 | 3/2002 |
| JP | 2003-215145 | 7/2003 |
| JP | 2004-69546 | 3/2004 |
| JP | 2004-163419 | 6/2004 |
| JP | 2005-098942 | 4/2005 |
| JP | 2005-257434 | 9/2005 |
| JP | 2005-300246 | 10/2005 |

OTHER PUBLICATIONS

U.S. Appl. No. 11/378,645, filed Mar. 20, 2006.
U.S. Appl. No. 10/589,246, filed Aug. 14, 2006, Takashi Takenaga, et al.
U.S. Appl. No. 12/601,098, filed Nov. 20, 2009, Furukawa, et al.
Qian et al., "Linear Spin-Valve Bridge Sensing Devices", IEEEE Trans. on Magnetics, vol. 40, No. 4, Jul. 2004, pp. 2643-2645.
Lenssen, K. et al., "Robust giant magnetoresistance sensors", Sensors and Actuators 85 (2000), Seiten 1-8.
German Office Action for Application 10 2006 035 661.6-35, dated Apr. 7, 2010 w/English Translation, 8 pages.

* cited by examiner

MAGNETIC FIELD DETECTION APPARATUS FOR DETECTING AN EXTERNAL MAGNETIC FIELD APPLIED TO A MAGNETORESISTANCE EFFECT ELEMENT, AND METHOD OF ADJUSTING THE SAME

BACKGROUND OF THE INVENTION

1. Field of the Invention

This invention relates to a magnetic field detection apparatus and a method of adjusting the apparatus, or in particular to a magnetic field detection apparatus having a magnetoresistance effect element of spin valve structure and a method of adjusting the apparatus.

2. Description of the Background Art

A method of detecting the angle position and the rotational speed of a rotary unit such as a motor based on the variation of the magnetic field of a magnet arranged on the surface of the rotary unit is known. The conventional magnetic field detection apparatus including a Hall element or a magnetoresistance effect element is generally used as a means for detecting a magnetic field.

The Hall element utilizes the Hall effect in which when a DC current is supplied along the long side of a thin film such as a semiconductor or the like and a magnetic field is applied from the direction perpendicular to the long side of the thin film, a voltage is generated in the direction along the plane of the semiconductor. The magnetoresistance effect element, on the other hand, utilizes the MR (magnetoresistance) effect in which the resistance value is changed under the effect of a magnetic field. In the case where a high detection accuracy is required, a magnetic field detection apparatus including a magnetoresistance effect element is generally used.

The magnetoresistance effect element includes an anisotropic magnetoresistance effect element (hereinafter sometimes referred to as the AMR element) utilizing the anisotropic magnetoresistance effect of a ferromagnetic material, a giant magnetoresistance effect element (hereinafter sometimes referred to as the GMR element) for developing a large resistance change rate with a stack structure of a ferromagnetic member and a nonmagnetic member, and a tunnel magnetoresistance effect element (hereinafter sometimes referred to as the TMR element) for generating the tunnel effect.

Japanese Patent Laying-Open No. 2004-069546, for example, discloses a magnetic field detection apparatus having a GMR element and detecting a mobile unit rotated in synchronism with a rotary shaft. This magnetic field detection apparatus disclosed in Japanese Patent Laying-Open No. 2004-069546 is so configured as not to cross the zero magnetic field by applying a bias magnetic field to the GMR element.

In recent years, a GMR element and a TMR element of spin valve structure having a larger resistance change rate and capable of realizing a high detection accuracy have been proposed. The spin valve structure has a stack of layers including a free layer with the direction of magnetization thereof changing with an external magnetic field and a pin layer with the direction of magnetization thereof fixed without regard to an external magnetic field.

Japanese Patent Laying-Open No. 04-358310, for example, discloses a magnetoresistance sensor having a spin valve structure. Also, Japanese Patent Laying-Open No. 2001-217478 discloses a TMR element having spin valve structure. Further, Japanese Patent Laying-Open No. 11-298063 discloses a TMR element of spin valve structure with the free layer implemented using a permanent magnet layer.

A detection apparatus using these magnetoresistance effect elements having the spin valve structure has also been proposed. Japanese Patent Laying-Open No. 08-226960, for example, discloses a Wheatstone bridge circuit formed of four GMR elements having the spin valve structure. Also, Japanese Patent Laying-Open No. 2003-215145 discloses a rotational speed detection apparatus using the TMR element having the spin valve structure.

As shown in FIG. 2 of Japanese Patent Laying-Open No. 08-226960, the magnetoresistance effect element of spin valve structure has a linear characteristic area generating a resistance value substantially proportional to the external magnetic field and a saturated area generating a predetermined resistance value regardless of the external magnetic field.

Referring to FIG. 39, the resistance value R of the magnetoresistance effect element is expressed as:

$$R = Rm + \Delta R/2 \times Hex/Hk \text{ (linear area: } -Hk \leq Hex \leq Hk\text{)}$$

$$R = Rm + \Delta R/2 = R\max \text{ (saturated area: } Hex \geq Hk\text{)}$$

$$R = Rm - \Delta R/2 = R\min \text{ (saturated area: } Hex \leq -Hk\text{)}$$

where Hex is the external magnetic field and Hk is the magnitude of the saturated magnetic field of the magnetoresistance effect element.

Generally, the detection apparatus using a magnetoresistance effect element of spin valve structure cannot accurately detect a magnetic field out of a linear characteristic area, and therefore the range of detecting the external magnetic field is limited to the magnitude of the saturated magnetic field.

In detecting a minuscule AC component from an external magnetic field containing a large DC component, therefore, the problem is posed that once the DC component exceeds the magnitude of the saturated magnetic field and the magnetoresistance effect element becomes a saturated state, a minuscule AC component cannot be detected.

Further, the magnitude of the saturated magnetic field is determined by the physical characteristics such as the material, thickness and shape of the free layer. Therefore, design and fabrication of the magnetoresistance effect element for various applications requires considerable labor and increases the cost.

SUMMARY OF THE INVENTION

Accordingly, an object of this invention is to provide a magnetic field detection apparatus capable of changing the detection range and the detection sensitivity as desired in accordance with a particular application.

Another object of this invention is to provide a method of adjusting the magnetic field detection apparatus so that the external magnetic field can be detected with high accuracy.

According to one aspect of the invention, there is provided a magnetic field detection apparatus including a magnetoresistance effect element having first and second ferromagnetic layers stacked with a first nonmagnetic layer interposed therebetween, and a detection circuit for detecting the external magnetic field applied to the magnetoresistance effect element, based on the resistance value of the magnetoresistance effect element. The first ferromagnetic layer has the direction of magnetization thereof fixed regardless of the external magnetic field and the second ferromagnetic layer has the direction of magnetization thereof changed in accordance with the external magnetic field, and wherein the magnetoresistance effect element has the resistance value thereof changed in accordance with the relation between the directions of magnetization in the first and second ferromagnetic layers, the magnetic field detection apparatus further including a bias unit for applying a bias magnetic field to the magnetoresistance effect element and changing a resistance value characteristic of the magnetoresistance effect element to the external magnetic field.

According to another aspect of the invention, there is provided a method of adjusting the magnetic field detection apparatus capable of detecting the external magnetic field generated by a mobile unit moved to approach first and second positions. The magnetic field detection apparatus includes first to fourth magnetoresistance effect elements each having first and second ferromagnetic layers stacked with a first nonmagnetic layer interposed therebetween, a detection circuit for detecting the external magnetic field based on the resistance value of the first to fourth magnetoresistance effect elements, and a bias unit for applying a bias magnetic field to the first to fourth magnetoresistance effect elements. The direction of magnetization of the first ferromagnetic layer is fixed regardless of the external magnetic field and the direction of magnetization of the second ferromagnetic layer changes with the external magnetic field, wherein the resistance value of each of the magnetoresistance effect elements changes in accordance with the relation of the direction of magnetization between the first and second ferromagnetic layers, wherein the first and second magnetoresistance effect elements are arranged at a first position and the third and fourth magnetoresistance effect elements are arranged at a second position, wherein each of the magnetoresistance effect elements is arranged so that the direction of magnetization of the first ferromagnetic layer is identical with the direction of the external magnetic field. The detection circuit makes up a bridge circuit with the first and second magnetoresistance effect elements constituting one pair of opposite sides and the third and fourth magnetoresistance effect elements the other pair of opposite sides, wherein an external magnetic field is detected based on the potential difference between opposite points of the bridge circuit caused by the difference in resistance value between the pair of the first and second magnetoresistance effect elements and the pair of the third and fourth magnetoresistance effect elements due to the movement of the mobile unit. According to a still another aspect of the invention, there is provided a method of adjusting the magnetic field detection apparatus, including the step of determining the position of the bias unit so that the potentials at opposite points of the bridge circuit are coincident with each other or the potential difference between opposite points of the bridge circuit is zero.

According to the one aspect of the invention, the direction of magnetization of the first ferromagnetic layer is changed with the external magnetic field, and the resistance of the magnetoresistance effect element is changed in accordance with the relation between the changed direction of magnetization of the first ferromagnetic layer and the fixed direction of magnetization of the second ferromagnetic layer. A bias unit applies a bias magnetic field thereby to change the characteristic of the direction of magnetization of the second ferromagnetic layer thereby to change the characteristic of the resistance value with respect to the external magnetic field. Thus, it is possible to realize the magnetic field detection apparatus capable of freely changing the detection range and the detection sensitivity as desired in accordance with a particular application.

According to the another aspect of the invention, the position of the bias unit is determined in such a manner that the bridge circuit is in equilibrium with no external magnetic field applied. Thus, it is possible to realize to adjust the magnetic field detection apparatus so that it can detect the external magnetic field with high accuracy.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
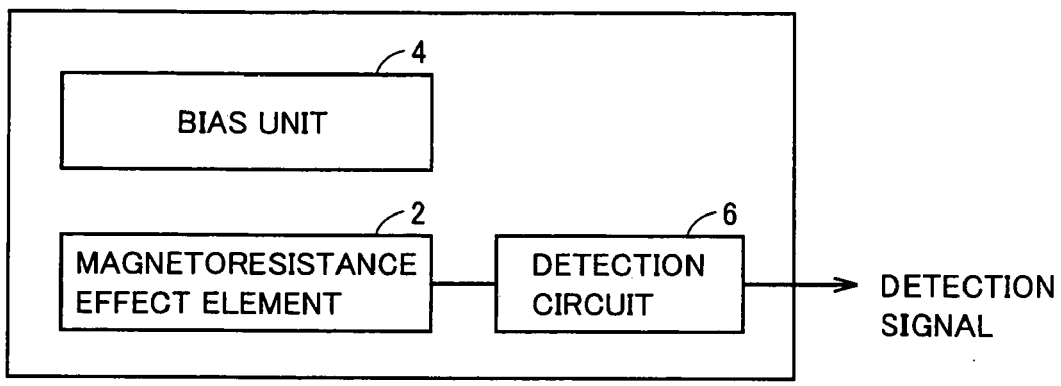
FIG. 1 is a diagram showing a schematic configuration of a magnetic field detection apparatus according to a first embodiment of the invention.

Embodiments of the invention are described in detail below with reference to the drawings. In the drawings, identical or equivalent component parts are designated by the same reference numerals, respectively, and not explained repeatedly.

First Embodiment

Referring to FIG. 1, a magnetic field detection apparatus 100 according to a first embodiment of the invention includes a magnetoresistance effect element 2, a bias unit 4 and a detection circuit 6.

Magnetoresistance effect element 2 is a TMR element or a GMR element having the spin valve structure. Magnetoresistance effect element 2 receives an external magnetic field to be detected and a bias magnetic field from bias unit 4, and changes in resistance in accordance with magnetic fields received. The description of the first embodiment that follows is the case that magnetoresistance effect element 2 is configured of a TMR element having the spin valve structure.

Detection circuit 6 applies a predetermined voltage or current to magnetoresistance effect element 2, detects the resistance value generated in magnetoresistance effect element 2 and outputs a detection signal corresponding to the external magnetic field. Magnetic field detection apparatus 100 may further include an arithmetic operation circuit for receiving the detection signal from detection circuit 6 and outputting a signal indicating the magnitude of the external magnetic field.

Bias unit 4 applies a predetermined bias magnetic field to magnetoresistance effect element 2 and thus changes the resistance value characteristic of magnetoresistance effect element 2 to the external magnetic field. Specifically, bias unit 4 changes the detection characteristics including the detection range and the detection sensitivity of the external magnetic field detected by magnetoresistance effect element 2. The bias unit 4 is configured of a magnet, an electromagnet, an electromagnetic coil or a ferromagnetic thin film formed on a substrate, of which a magnet generating a bias magnetic field without any external power supply is preferable. The first embodiment is explained below in the case where bias unit 4 is formed of a magnet.

Figure 2:
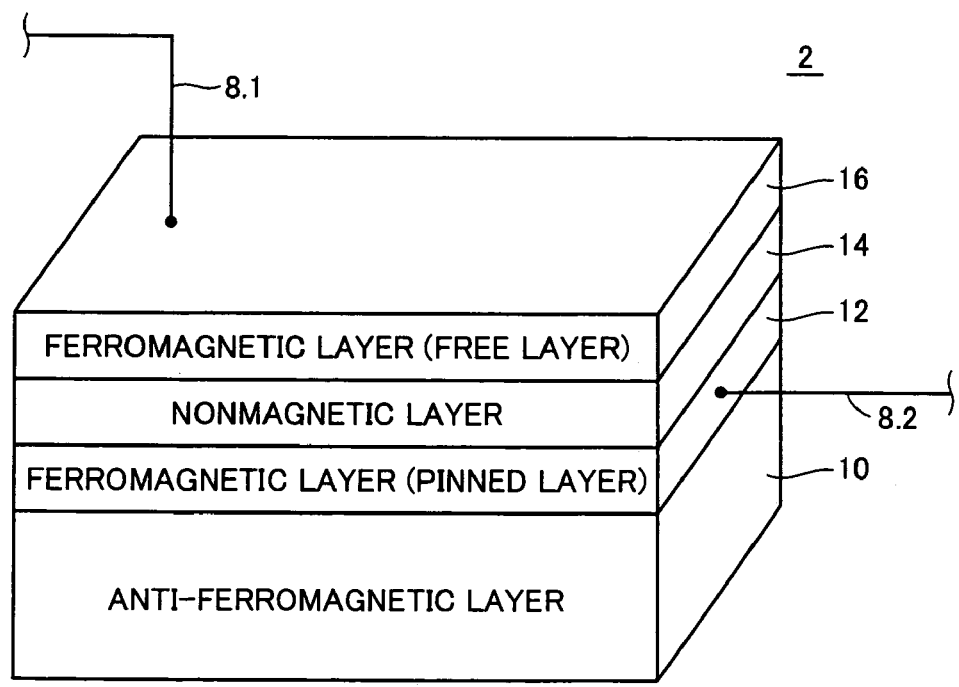
FIG. 2 is a diagram showing a schematic configuration of a magnetoresistance effect element.

Referring to FIG. 2, magnetoresistance effect element 2 has a stack structure of an anti-ferromagnetic layer 10, a ferromagnetic layer 12, a nonmagnetic layer 14 and a ferromagnetic layer 16 joined in that order. Ferromagnetic layers 12 and 16 are magnetized by the internal magnetic field and the external magnetic field, respectively.

Ferromagnetic layer 12 joined to anti-ferromagnetic layer 10 generates an exchange-coupling field with the direction of magnetization fixed regardless of the external magnetic field. Ferromagnetic layer 12 with the direction of magnetization fixed in this way is hereinafter referred to also as a pinned layer.

Ferromagnetic layer 16, on other hand, is joined to nonmagnetic layer 14 and therefore not affected by ferromagnetic layer 12 and anti-ferromagnetic layer 10, and changes in the direction of magnetization in accordance with the external magnetic field. Ferromagnetic layer 16 with the direction of magnetization thereof changed in accordance with the external magnetic field in this way is hereinafter referred to also as a free layer.

Magnetoresistance effect element 2 configured of the TMR element may be formed of, for example, an anti-ferromagnetic layer 10 of IrMn, a ferromagnetic layer 12 having the composition of NiFe and CoFe, a nonmagnetic layer 14 of $Al_2O_3$ and a ferromagnetic layer 16 of NiFe.

Further, FeMn, IrMn or PtMn may be used for anti-ferromagnetic layer 10. Also, ferromagnetic layers 12 and 16 may be formed of a metal material containing Co, Ni or Fe as a main component, such as Co, Fe, a CoFe alloy, a CoNi or a CoFeNi alloy, or an alloy such as NiMnSb or COMnGe. Nonmagnetic layer 14 may be an insulating material causing the tunnel effect such a metal oxide as $Ta_2O_5$, $SiO_2$ or MgO or a fluoride metal.

The resistance value of magnetoresistance effect element 2 is changed in accordance with the relation between the direction of magnetization of ferromagnetic layer 12 (pinned layer) and the direction of magnetization of ferromagnetic layer 16 (free layer). Specifically, the resistance value of magnetoresistance effect element 2 changes in accordance with the angle between the magnetized vector of ferromagnetic layer 16 rotated depending on the external magnetic field and the magnetized vector of the fixed ferromagnetic layer 12.

Magnetoresistance effect element 2 configured of the TMR element is supplied with a current through a wire 8.1, connected to ferromagnetic layer 16, and a wire 8.2, connected to ferromagnetic layer 12, in such a manner that a current flows between ferromagnetic layers 12 and 16 through nonmagnetic layer 14 making up an insulating member. Specifically, the tunnel current, passed through nonmagnetic layer 14 of an insulating material by the tunnel effect, changes in accordance with the external magnetic field, and so does the resistance value of magnetoresistance effect element 2.

The size of each layer perpendicular to the junction surfaces, i.e. the thickness of each layer of magnetoresistance effect element 2 is about 1/100 of the size of short side of each layer on the surfaces. As a result, magnetoresistance effect element 2 is strongly affected by the magnetic shape anisotropy, and the magnetization component perpendicular to the junction surfaces can be substantially ignored as compared with the magnetic field component parallel to junction surfaces. Therefore, magnetoresistance effect element 2 substantially is not changed in resistance by the external magnetic field which may be received from the direction perpendicular to the junction surfaces, but mainly by the external magnetic field parallel to the junction surfaces.

In the description that follows, therefore, the magnetized vector generated in ferromagnetic layer 16 (free layer) and ferromagnetic layer 12 (pinned layer) is regarded as a two-dimensional vector changing only in the directions on the surfaces thereof.

The magnetized vector of ferromagnetic layer 16 (free layer) is changed by the external magnetic field. The direction of magnetization of ferromagnetic layer 16 (free layer) while the external magnetic field is not applied thereto can be determined beforehand. By setting the magnetized vector generated in ferromagnetic layer 12 (pinned layer) and the magnetized vector generated in ferromagnetic layer 16 (free layer) at right angles to each other with no external magnetic field applied thereto, therefore, the sensitivity of the resistance value against the external magnetic field can be increased.

In a method of determining the direction of magnetization of ferromagnetic layer 12 (pinned layer) beforehand, an external magnetic field having the desired direction of magnetization is applied to ferromagnetic layer 12 (pinned layer) while carrying out the heat treatment (annealing) after fabrication of magnetoresistance effect element 2. In this way, the direction of magnetization of ferromagnetic layer 12 (pinned layer) can be determined as desired.

Ferromagnetic layer 16 (free layer) rectangular in shape on the surface thereof generates a magnetized vector in the direction along the long side thereof due to the magnetic shape anisotropy. Therefore, the direction of magnetization of ferromagnetic layer 16 (free layer) can be determined by fabricating a rectangular ferromagnetic layer 16 (free layer) in such a manner that desired direction of the magnetized vector and the long side of the rectangle correspond to each other.

Figure 3:
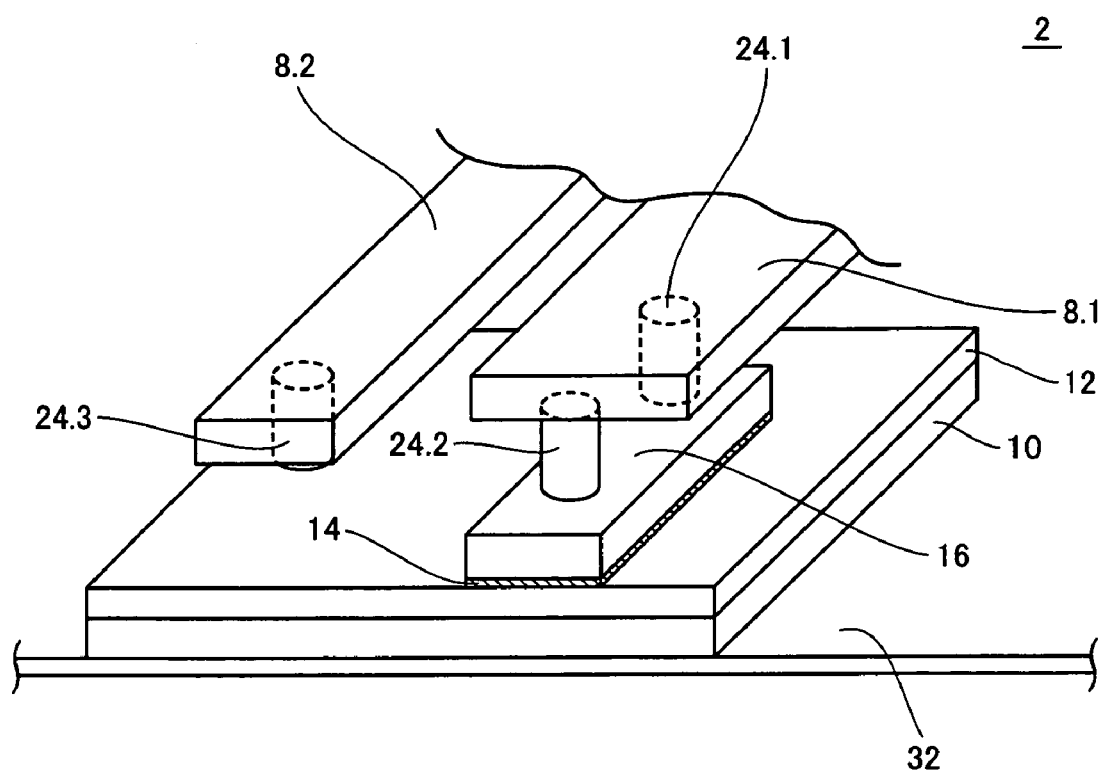
FIG. 3 is a diagram showing the substantial portion a magnetoresistance effect element configured of a TMR element.

Referring to FIG. 3, magnetoresistance effect element 2 includes anti-ferromagnetic layer 10 and ferromagnetic layer 12 stacked on substrate 32. Nonmagnetic layer 14 and ferromagnetic layer 16 are stacked on the surface of ferromagnetic layer 12 opposite from the joint surface with anti-ferromagnetic layer 10. Further, wire 8.1 is connected to ferromagnetic layer 16 through contacts 24.1 and 24.2, and wire 8.2 is connected to ferromagnetic layer 12 through a contact 24.3.

Wires 8.1 and 8.2 are made of Al, for example.

Anti-ferromagnetic layer 10, ferromagnetic layer 12, nonmagnetic layer 14 and ferromagnetic layer 16 stacked on the substrate in this way can be formed either by sputtering such as DC magnetron sputtering, by vapor deposition such as molecular beam epitaxy (MBE) or by chemical vapor deposition (CVD) such as optical CVD.

After stacking each layer on the substrate, a photolithography method is executed, wherein the desired pattern is transferred by photoresist, and further, the desired structure is formed by the ion milling or reactive ion etching. In this way, magnetoresistance effect element 2 shown in FIG. 3 can be fabricated. In place of the photolithography, the electron beam lithography or the focused ion beam method may be employed.

Figure 4:
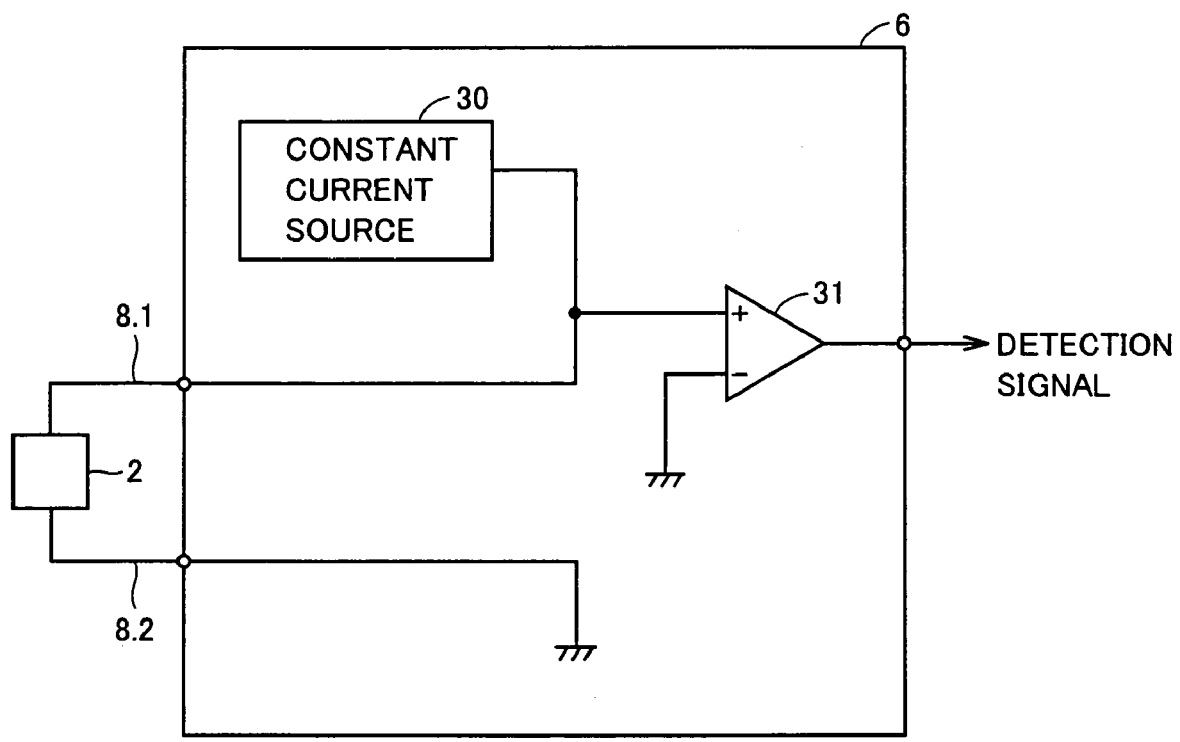
FIG. 4 is a diagram showing a schematic configuration of a detection circuit.

Referring to FIG. 4, detection circuit 6 supplies a constant current to magnetoresistance effect element 2 through wires 8.1 and 8.2 and outputs a detection signal corresponding to the voltage generated in magnetoresistance effect element 2 by the constant current. Detection circuit 6 includes a constant current source 30 and a preamplifier 31.

Constant current source 30 supplies a constant current regardless of the resistance value of magnetoresistance effect element 2.

Preamplifier 31 outputs by amplifying the potential difference between the potential at the connection point of constant current source 30 and magnetoresistance effect element 2 and a reference potential with a predetermined amplification factor.

Figure 5A:
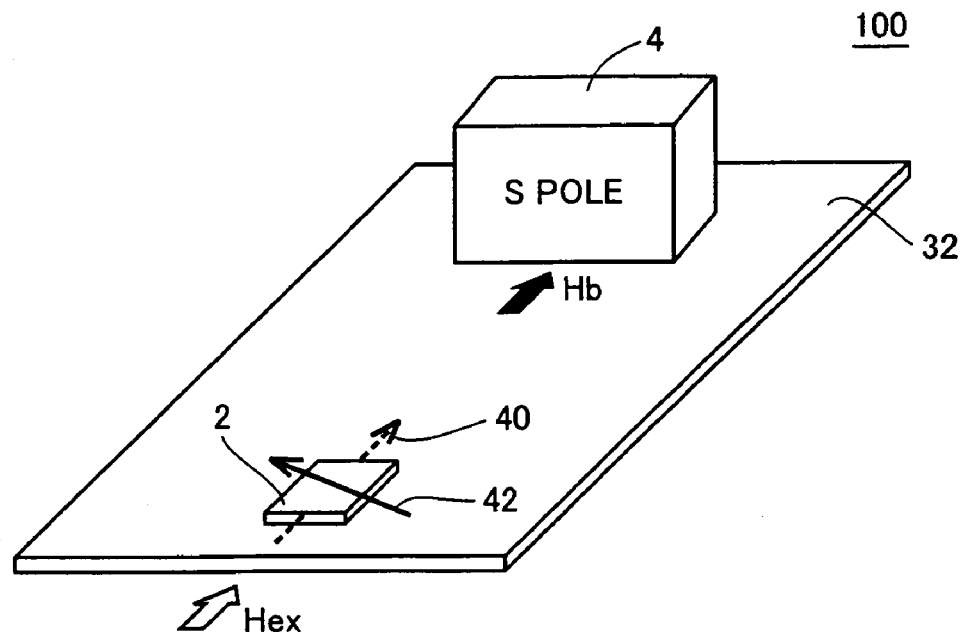
FIGS. 5A and 5B are diagrams showing the substantial portion of a magnetic field detection apparatus according to the first embodiment of the invention.

FIG. 5A is a perspective view of magnetic field detection apparatus 100.

Figure 5B:
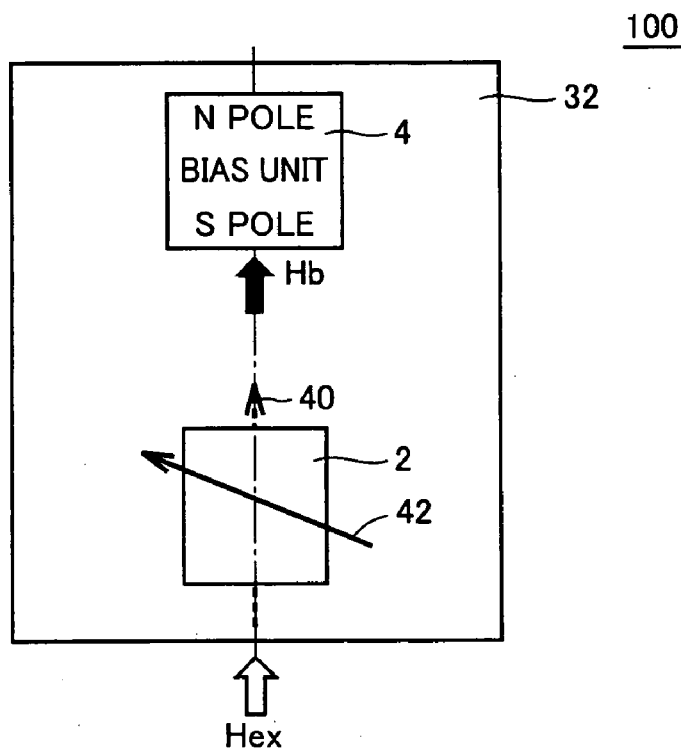

FIG. 5B is a plan view of magnetic field detection apparatus 100.

Referring to FIG. 5A, magnetic field detection apparatus 100 includes magnetoresistance effect element 2, formed on substrate 32, and bias unit 4 arranged in opposed relation to magnetoresistance effect element 2. In magnetic field detection apparatus 100, bias unit 4 is arranged with the center axis thereof aligned with that of magnetoresistance effect element 2.

Referring to FIG. 5B, bias unit 4 generates a magnetic field Hb toward bias unit 4 from magnetoresistance effect element 2 along the line connecting the center of bias unit 4 and the center of magnetoresistance effect element 2.

In magnetoresistance effect element 2, on the other hand, a magnetized vector 40 of the pinned layer is fixed in the direction toward bias unit 4 from magnetoresistance effect element 2 along the line connecting the center of bias unit 4 and the center of magnetoresistance effect element 2, while a magnetized vector 42 of the free layer can be rotated, under the effect of an external magnetic field Hex, in the direction parallel to magnetized vector 40 of the pinned layer from the direction perpendicular to magnetized vector 40 of the pinned layer.

Specifically, magnetoresistance effect element 2 detects external magnetic field Hex varying in magnitude along the same direction as magnetized vector 40 of the pinned layer. In the case where external magnetic field Hex is sufficiently large, magnetized vector 42 of the free layer becomes parallel or anti-parallel to magnetized vector 40 of the pinned layer, and therefore a wide range in which the resistance value changes with the variety in external magnetic field Hex can be secured.

As described above, a bias magnetic field Hb and external magnetic field Hex are applied to magnetoresistance effect element 2. Bias magnetic field Hb and external magnetic field Hex are generated on the same straight line, and therefore bias magnetic field Hb functions to hamper external magnetic field Hex applied to magnetoresistance effect element 2. Therefore, the magnetization of the free layer in magnetoresistance effect element 2 is suppressed and the rotation angle of magnetized vector 42 reduced.

Thus, the characteristic of the resistance value of magnetoresistance effect element 2 with respect to external magnetic field Hex is shifted by the amount equivalent to bias magnetic field Hb.

Figure 6:
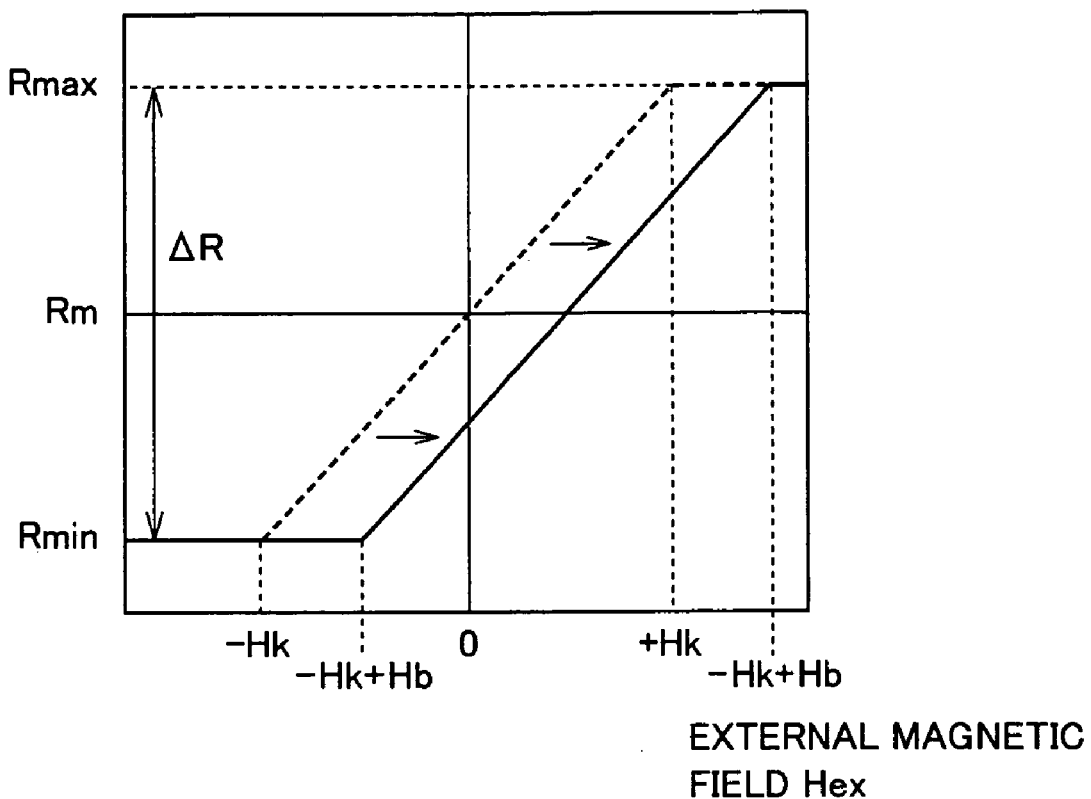
FIG. 6 is a schematic diagram showing the relation between the external magnetic field and the resistance value of the magnetic field detection apparatus according to the first embodiment of the invention.

Referring to FIG. 6, in the absence of bias magnetic field Hb from bias unit 4, magnetoresistance effect element 2 has a linear characteristic area within the range of −Hk to Hk (Hk: magnitude of saturated magnetic field).

In measuring the magnitude of external magnetic field Hex, for example, the magnitude of external magnetic field Hex and resistance value R, i.e. the magnitude of external magnetic field Hex and the detection signal are desirably proportional to each other. In measuring the magnitude of external magnetic field Hex, therefore, the measurable range is −Hk to Hk where magnetoresistance effect element 2 operates in a linear characteristic area.

By applying bias magnetic field Hb from bias unit 4, the linear characteristic area of magnetoresistance effect element 2 is shifted to the range of −Hk+Hb to +Hk+Hb. As a result, the measurable range of magnetic field detection apparatus 100 is shifted by the amount equal to bias magnetic field Hb.

As described above, by selecting bias magnetic field Hb appropriately in accordance with the variable range of external magnetic field Hex to be measured, magnetic field detection apparatus 100 can detect a minuscule AC component from external magnetic field Hex containing a large DC component.

Figure 7A:
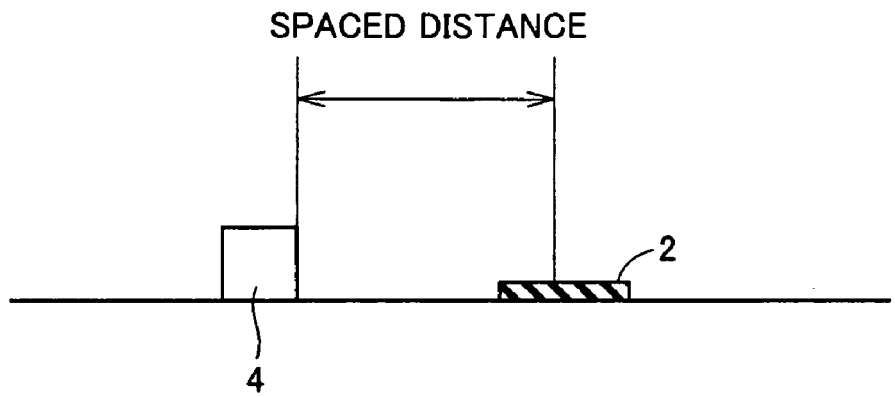
FIGS. 7A and 7B show an example of the relation between the bias unit and the bias magnetic field.
Figure 7B:
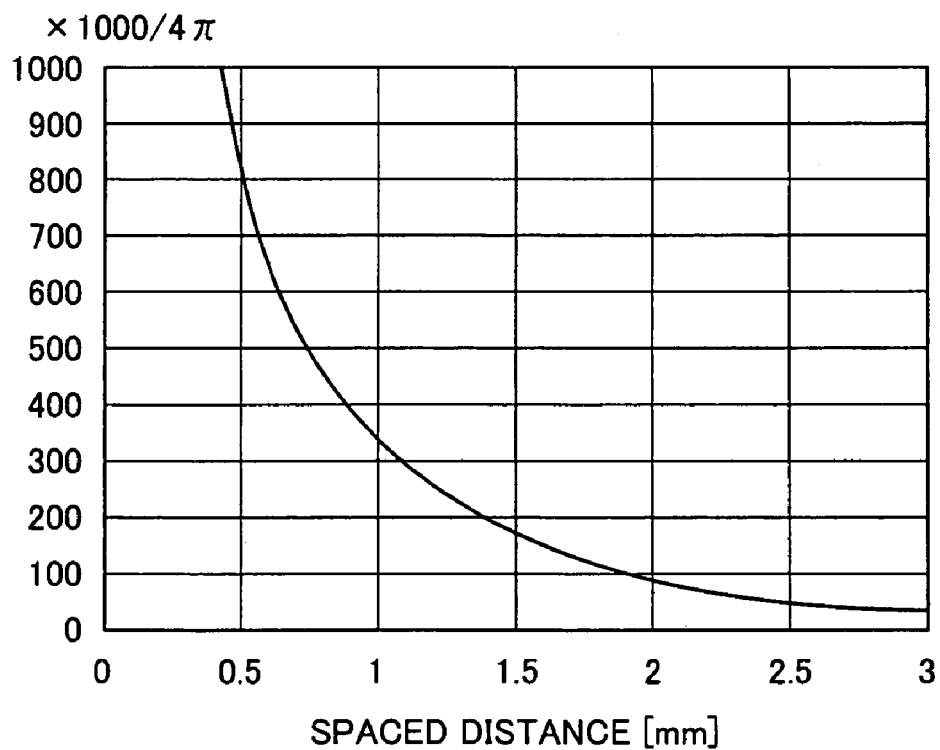

FIGS. 7A and 7B show an example of the relation between bias unit 4 and bias magnetic field Hb. FIGS. 7A and 7B show a case where a SmCo magnet (rare-earth samarium-cobalt magnet) formed in a cube having each side of 1 mm is used as bias unit 4.

FIG. 7A shows relative positions of bias unit 4 and magnetoresistance effect element 2.

FIG. 7B shows the characteristic of the magnitude of bias magnetic field Hb to the spaced distance between bias unit 4 and magnetoresistance effect element 2.

Referring to FIGS. 5B and 7A, the distance between the end side of bias unit 4 and the center of magnetoresistance effect element 2 on the line connecting the center of bias unit 4 and the center of magnetoresistance effect element 2 is defined as the spaced distance.

Figure 8:
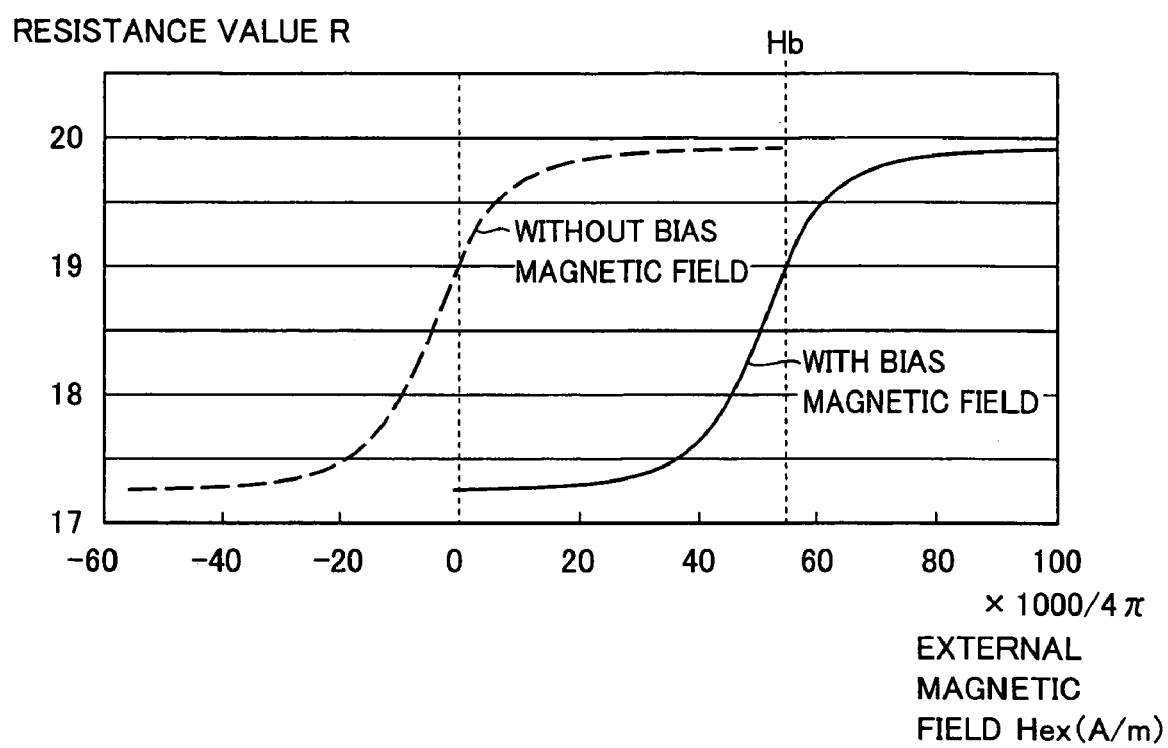
FIG. 8 shows an example of the relation between the external magnetic field and the resistance value with the spaced distance of 2.5 mm in FIG. 7B.

Referring to FIG. 8, assuming that the spaced distance is 2.5 mm, for example, bias magnetic field Hb applied to magnetoresistance effect element 2 is given as $55 \times 10^3/4\pi$ A/m. The detection range of magnetic field detection apparatus 100, therefore, is shifted by $55 \times 10^3/4\pi$ A/m.

Referring to FIG. 8, in the case where bias magnetic field Hb is not applied, a linear characteristic area centered at zero external magnetic field Hex is caused where resistance value R is substantially proportional to external magnetic field Hex. Assuming that the spaced distance between bias unit 4 and magnetoresistance effect element 2 is 2.5 mm, on the other hand, bias magnetic field Hb of $55 \times 10^3/4\pi$ A/m is applied to magnetoresistance effect element 2. Therefore, a linear characteristic area centered at bias magnetic field Hb is obtained where resistance value R is substantially proportional to external magnetic field Hex.

Further, in magnetic field detection apparatus 100, it is desirable to suppress the noise of the detection signal caused by the external magnetic field. By forming magnetoresistance effect element 2 and a preamplifier 31 on the same substrate, the wiring distance from preamplifier 31 to magnetoresistance effect element 2 is shortened so that the noise intruding into the wiring from the bias magnetic field and the external magnetic field can be suppressed.

Figure 9:
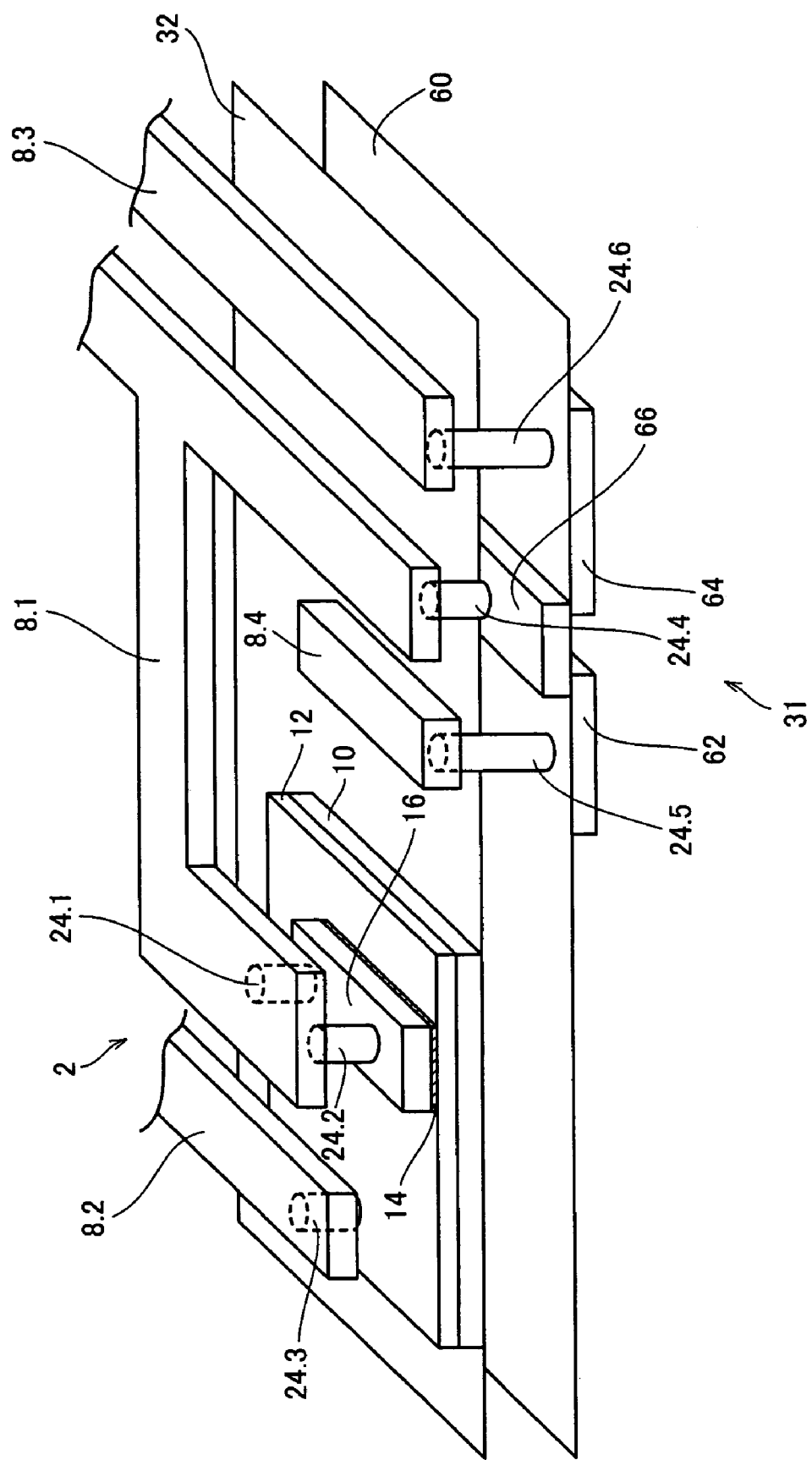
FIG. 9 is a diagram showing the substantial portion of the magnetoresistance effect element and the detection circuit.

Referring to FIG. 9, the structure of magnetoresistance effect element 2 is similar to FIG. 3 and therefore detailed description will not be repeated here. A gate 66 is formed on the surface of substrate 32 opposite from the surface thereof on which magnetoresistance effect element 2 is formed. A source 62 and a drain 64 are formed on an oxide film 60 on the surface opposite from gate 66. Gate 66, source 62, drain 64 and oxide film 60 make up preamplifier 31.

Further, gate 66 is connected to wire 8.1 through a contact 24.4, source 62 to wire 8.4 through a contact 24.5 and drain 64 to wire 8.3 through a contact 24.6.

Thus, gate 66 is supplied with a voltage generated in ferromagnetic layer 16 of magnetoresistance effect element 2 thereby to generate a current, corresponding to the particular voltage value, from source 62 to drain 64. The current flowing from source 62 to drain 64 is output as a detection signal through wire 8.3.

As described, gate 66 of preamplifier 31 making up detection circuit 6 is so structured as to be formed on substrate 32 shared by magnetoresistance effect element 2 for a shorter wiring distance, so that the effect of the bias magnetic field and the external magnetic field is suppressed thereby to realize magnetic field detection apparatus 100 small in noise.

(First Modification)

The first embodiment described above refers to magnetoresistance effect element 2 configured of a TMR element having the spin valve structure. Further, a GMR element having the spin valve structure may alternatively be employed.

Figure 10A:
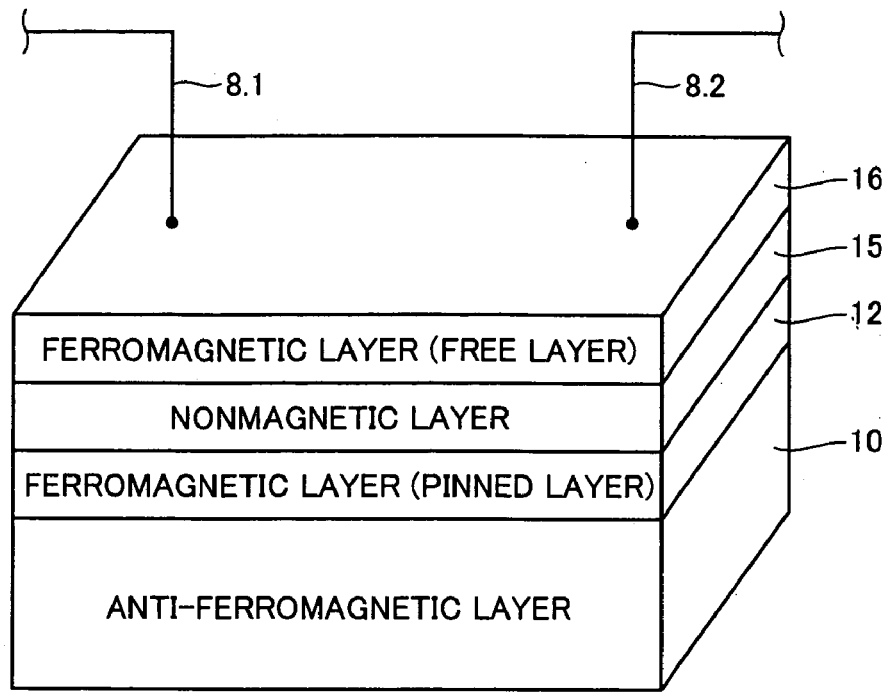
FIGS. 10A and 10B are diagrams showing the substantial portion of the magnetoresistance effect element formed of a GMR element.

FIG. 10A is a diagram showing a schematic configuration.

Figure 10B:
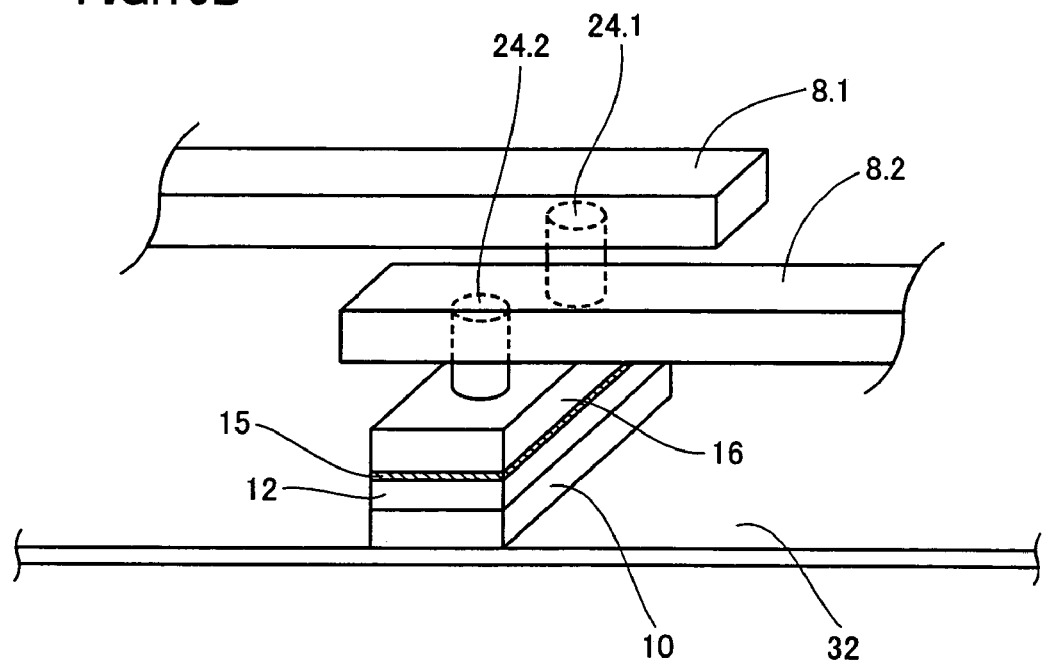

FIG. 10B is a diagram showing the substantial portion.

Referring to FIG. 10A, the GMR element includes an anti-ferromagnetic layer 10 and a ferromagnetic layer 12 stacked on substrate 32. A nonmagnetic layer 15 of a metal material and a ferromagnetic layer 16 are stacked on the surface of ferromagnetic layer 12 opposite from the junction surface with anti-ferromagnetic layer 10.

Referring to FIG. 10B, the GMR element has wires 8.1 and 8.2 connected to ferromagnetic layer 16 through contacts 24.1 and 24.2, respectively. Nonmagnetic layer 15 can be formed of a metal material such as Cu.

Referring to FIGS. 10A and 10B, the current supplied from detection circuit 6 (FIG. 1) through wire 8.1, connected to ferromagnetic layer 16, flows mainly along the plane of nonmagnetic layer 15 and is output from wire 8.2 connected to ferromagnetic layer 16. In accordance with the magnetized vector of ferromagnetic layer 12 (pinned layer) and the magnetized vector of ferromagnetic layer 16 (free layer), the current flowing in nonmagnetic layer 15 is so affected as to change the resistance value of the GMR element.

The current (electrons) flowing in nonmagnetic layer 15 is scattered in the two boundary surfaces of nonmagnetic layer 15, i.e. the junction surface between ferromagnetic layer 16 and nonmagnetic layer 15 and the junction surface between ferromagnetic layer 12 and nonmagnetic layer 15. The degree to which this current (electrons) is scattered is determined by the difference between the magnetized vector of ferromagnetic layer 12 (pinned layer) and the magnetized vector of ferromagnetic layer 16 (free layer). Specifically, in the case where the magnetized vector of ferromagnetic layer 12 (pinned layer) and the magnetized vector of ferromagnetic layer 16 (free layer) coincide with each other in direction, the current (electrons) is not easily scattered and the electric resistance is reduced. In the case where the magnetized vector of ferromagnetic layer 12 (pinned layer) and the magnetized vector of ferromagnetic layer 16 (free layer) are opposite in direction, on the other hand, the current (electrons) is easily scattered and the electric resistance increases.

As described above, the GMR element and the TMR element produce the magnetoresistance effect on different principles. The characteristics of the two elements to the external magnetic field and the characteristics as viewed from the detection circuit are substantially equivalent to each other, and therefore magnetoresistance effect element 2 can be configured of the GMR element in place of the TMR element.

(Second Modification)

Further, in the spin valve structure shown in FIG. 2, a pinned layer having a SAF (synthesis anti-ferroelectrics) structure including a stack of a ferromagnetic layer and a nonmagnetic layer may be employed in place of the pinned layer having a single ferromagnetic layer.

Figure 11:
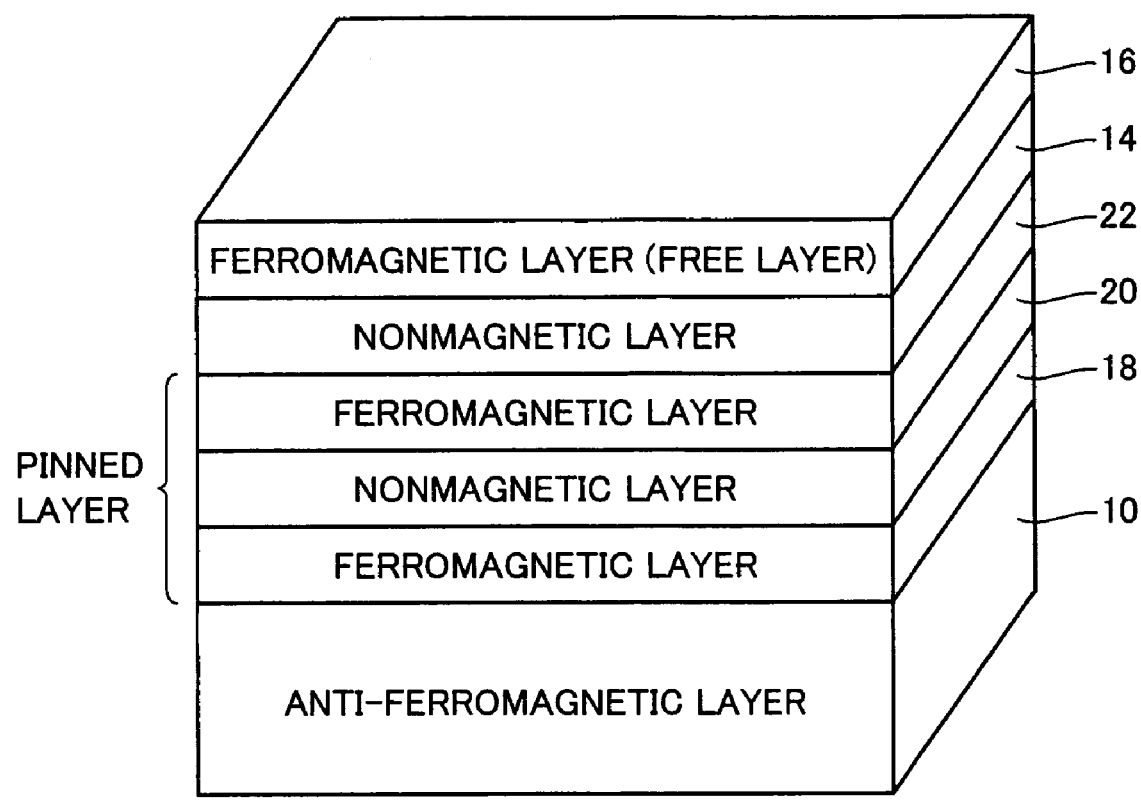
FIG. 11 is a diagram showing a schematic configuration of the magnetoresistance effect element including the pinned layer of SAF structure.

Referring to FIG. 11, magnetoresistance effect element 2 having the pinned layer of SAF structure includes a ferromagnetic layer 18, a nonmagnetic layer 20 and a ferromagnetic layer 22 in place of ferromagnetic layer 12 of magnetoresistance effect element 2 shown in FIG. 2. Nonmagnetic layer 20 is formed of, for example, Ru or Cu.

Ferromagnetic layers 18 and 22 are magnetized with such magnetic vectors as to offset each other. Both ferromagnetic layer 22 and ferromagnetic layer 16 (free layer) have magnetized vectors and therefore are so correlated as to produce a similar characteristic to magnetoresistance effect element 2 shown in FIG. 2. In ferromagnetic layers 18 and 22 combined, on the other hand, the magnetized vectors thereof offset each other and become substantially zero. Even in the case where a strong external magnetic field is applied to ferromagnetic layers 18 and 22 making up a pinned layer from the direction perpendicular to the junction surface thereof, therefore, the magnetization of the respective layers is not easily changed, and the magnetized vector of the pinned layer as a whole is stabilized.

The first embodiment explained above refers to a case in which bias unit 4 is fixed in advance at a predetermined position. Provision of a mechanism for moving bias unit 4, however, makes it possible to detect various external magnetic fields Hex.

According to the first embodiment of the invention, bias unit 4 applies a bias magnetic field in the same direction as the external magnetic field. The external magnetic field applied to magnetoresistance effect element 2 is combined with the bias magnetic field. As a result, an external magnetic field substantially plus or minus the bias magnetic field from bias unit 4 is applied to magnetoresistance effect element. In this way, the characteristic of the resistance value of magnetoresistance effect element to the external magnetic field can be shifted by the amount equivalent to the bias magnetic field. By setting an optimum bias magnetic field, therefore, a magnetic field detection apparatus can be realized in which the detection range is shifted to the desired range in accordance with the variable range of the external magnetic field.

Second Embodiment

The first embodiment described above refers to a configuration in which the bias magnetic field is applied in the direction parallel to the external magnetic field. In the second embodiment, on the other hand, an explanation is made about a configuration in which the bias magnetic field is applied in the direction perpendicular to the external magnetic field.

Figure 12A:
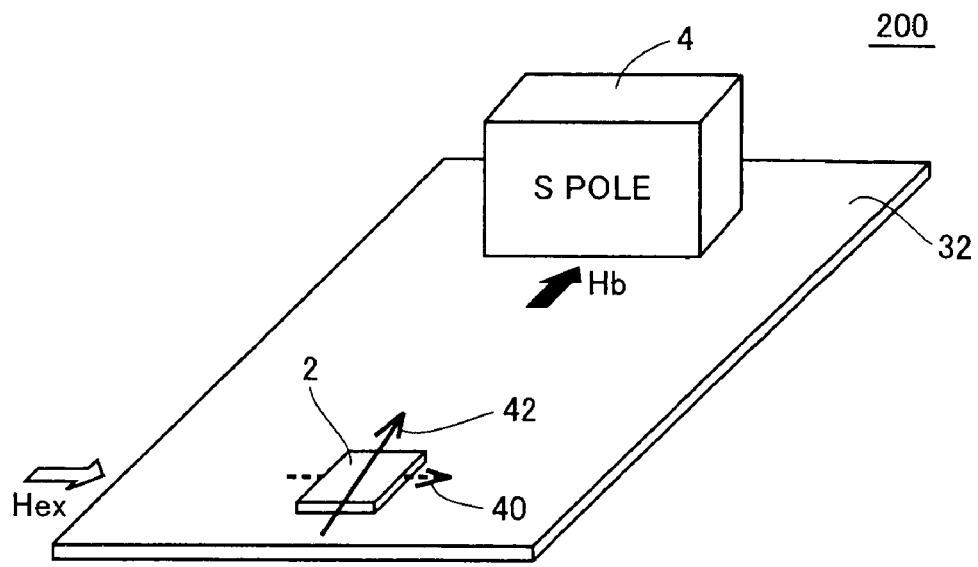
FIGS. 12A and 12B are diagrams showing the substantial portion of the magnetic field detection apparatus according to the second embodiment of the invention.

FIG. 12A is a perspective view showing magnetic field detection apparatus 200 according to the second embodiment.

Figure 12B:
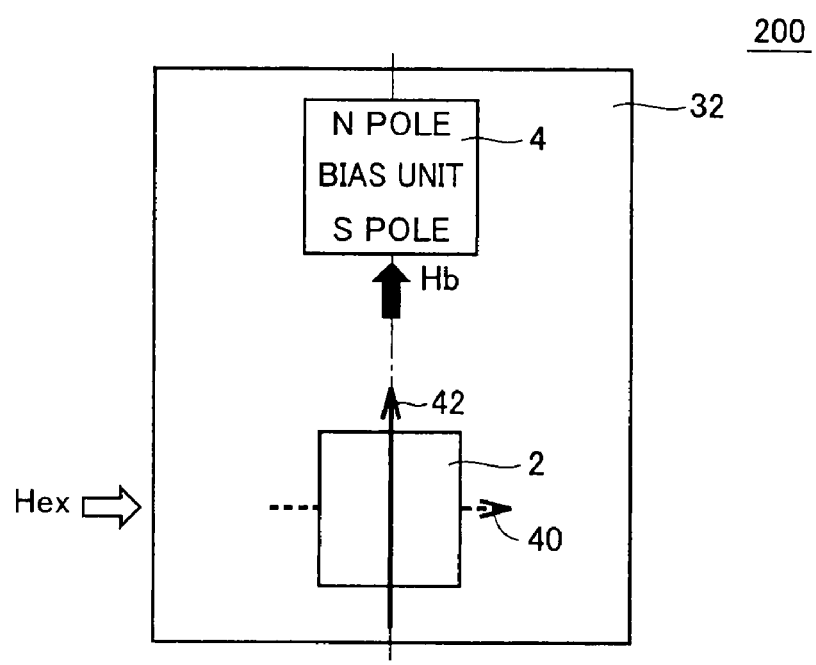

FIG. 12B is a plan view showing magnetic field detection apparatus 200 according to the second embodiment.

Referring to FIG. 12A, magnetic field detection apparatus 200 includes a magnetoresistance effect element 2 formed on a substrate 2 and a bias unit 4 arranged in opposed relation to magnetoresistance effect element 2. In magnetic field detection apparatus 200, the center axis of bias unit 4 is aligned with the center axis of magnetoresistance effect element 2. In the direction perpendicular to the line connecting the center of bias unit 4 and the center of magnetoresistance effect element 2, magnetic field detection apparatus 200 detects external magnetic field Hex varying in direction and magnitude.

Referring to FIG. 12B, bias unit 4 generates bias magnetic field Hb from magnetoresistance effect element 2 toward bias unit 4 along the line connecting the center of bias unit 4 and the center of magnetoresistance effect element 2.

Magnetoresistance effect element 2 detects external magnetic field Hex varying in magnitude along the same direction as magnetized vector 40 of the pinned layer. In magnetoresistance effect element 2, magnetized vector 40 of the pinned layer is fixed in the direction perpendicular to the line connecting the center of bias unit 4 and the center of magnetoresistance effect element 2. Magnetized vector 42 of the free layer, when viewed as a whole, is rotated in the direction parallel to magnetized vector 40 of the pinned layer from the direction perpendicular to magnetized vector 40 of the pinned layer in response to external magnetic field Hex.

As described above, bias magnetic field Hb and external magnetic field Hex are applied to magnetoresistance effect element 2. In the process, bias magnetic field Hb functions to maintain magnetized vector 42 of the free layer of magnetoresistance effect element 2 in the direction of bias unit 4. Specifically, magnetized vector 42 of the free layer is prevented from changing in direction by bias magnetic field Hb, and therefore the response (sensitivity) of magnetized vector 42 of the free layer to external magnetic field Hex is reduced.

As a result, the characteristic of the resistance value of magnetoresistance effect element 2 to external magnetic field Hex followed a gentle curve of change amount in accordance with bias magnetic field Hb.

Figure 13:
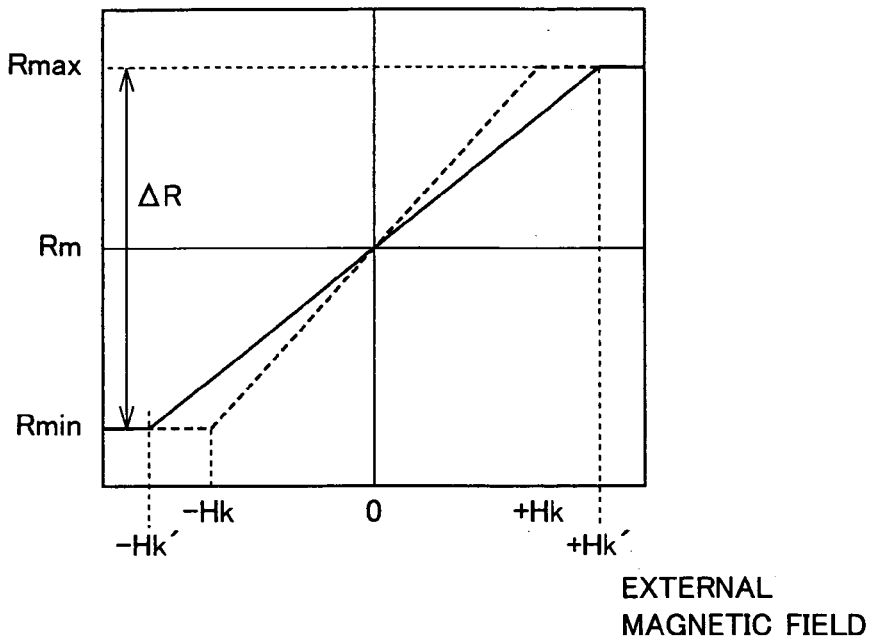
FIG. 13 is a schematic diagram showing the relation between the external magnetic field and the resistance value of the magnetic field detection apparatus according to the second embodiment of the invention.

Referring to FIG. 13, magnetoresistance effect element 2 has an area of linear characteristic in the range of −Hk to Hk (Hk: magnitude of saturated magnetic field) in the absence of bias magnetic field Hb from bias unit 4. Upon application of bias magnetic field Hb from bias unit 4, on the other hand, the linear characteristic area of magnetoresistance effect element 2 is enlarged to the range of −Hk' to Hk' (Hk': magnitude of saturated magnetic field with bias magnetic field Hb applied).

Like in the first embodiment, in measuring the magnitude of external magnetic field Hex, the range in which the characteristic curve of magnetoresistance effect element 2 is linear corresponds to a measurable range. By applying bias magnetic field Hb, the measurable range of magnetic field detection apparatus 200 is increased Hk'/Hk times.

As described above, by selecting the bias magnetic field Hb appropriately in accordance with the variable amount of external magnetic field Hex to be measured, magnetic field detection apparatus 200 increases in measurement range and can detect a wider range of external magnetic field Hex.

Figure 14:
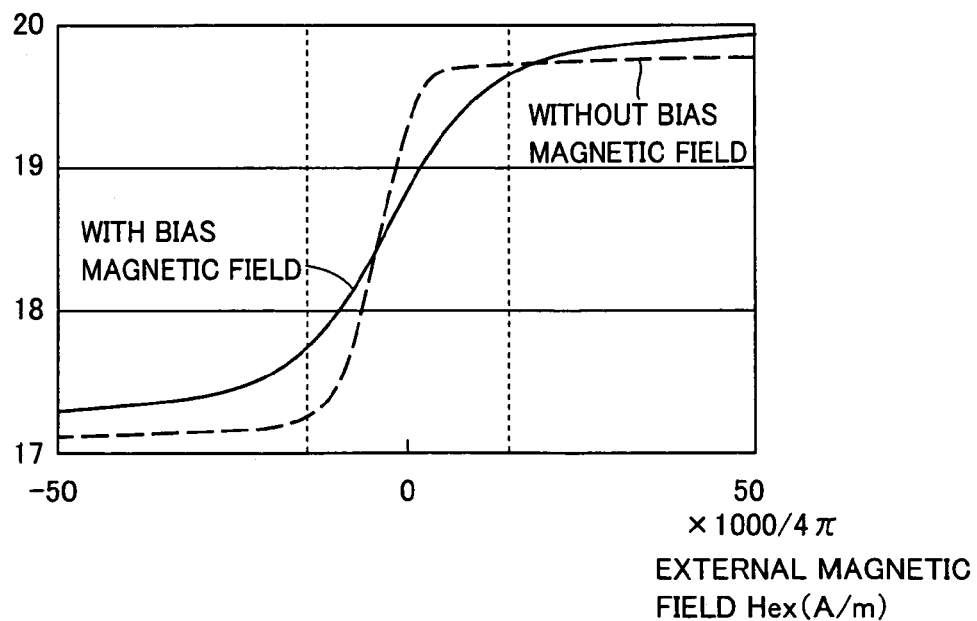
FIG. 14 shows an example of the relation between the external magnetic field and the resistance value in the case where the SmCo magnet shown in FIG. 7 is used as a bias unit.

FIG. 14 shows an example of the relation between external magnetic field Hex and resistance value R in the case where the SmCo magnet shown in FIG. 7 is used as bias unit 4. In FIG. 14, the spaced distance between bias unit 4 and magnetoresistance effect element 2 shown in FIG. 7 is assumed to be 5.6 mm.

Referring to FIG. 14, in the case where bias magnetic field Hb is not applied, a linear characteristic area to external magnetic field Hex is within the range of about $\pm 10 \times 10^3/4\pi$ A/m. Upon application of bias magnetic field Hb, on the other hand, a linear characteristic area to external magnetic field Hex is obtained within the range of about $\pm 20 \times 10^3/4\pi$ A/m.

Specifically, it is understood that bias magnetic field Hb reduces the sensitivity of resistance value R to external magnetic field Hex and increases the detectable range of external magnetic field Hex.

The other points are similar to those of the first embodiment and therefore detailed description will not be repeated here.

According to the second embodiment of the invention, the bias unit applies a bias magnetic field in the direction perpendicular to the direction of magnetization of the pinned layer of the magnetoresistance effect element, and therefore the magnetized vector in the free layer of the magnetoresistance effect element tends to be maintained in the direction perpendicular to the direction of magnetization of the pinned layer. As a result, the magnetized vector in the free layer of the magnetoresistance effect element is not readily rotated in the direction of magnetization of the pinned layer even under the effect of the external magnetic field thereby to reduce the sensitivity to the external magnetic field. In other words, the sensitivity of detecting the resistance value to the external magnetic field of the magnetoresistance effect element is reduced. Thus, a magnetic field detection apparatus is provided in which by setting the optimum bias magnetic field, the detection range can be increased to the desired extent in accordance with the variable range of the external magnetic field.

Third Embodiment

The first and second embodiments are explained above with reference to a configuration in which the bias magnetic field is applied in the direction parallel or perpendicular to the external magnetic field. In the third embodiment, on the other hand, a configuration is explained in which a bias magnetic field is applied in such a manner that a component parallel to the external magnetic field and a component perpendicular to the external magnetic field are generated at the same time.

Figure 15A:
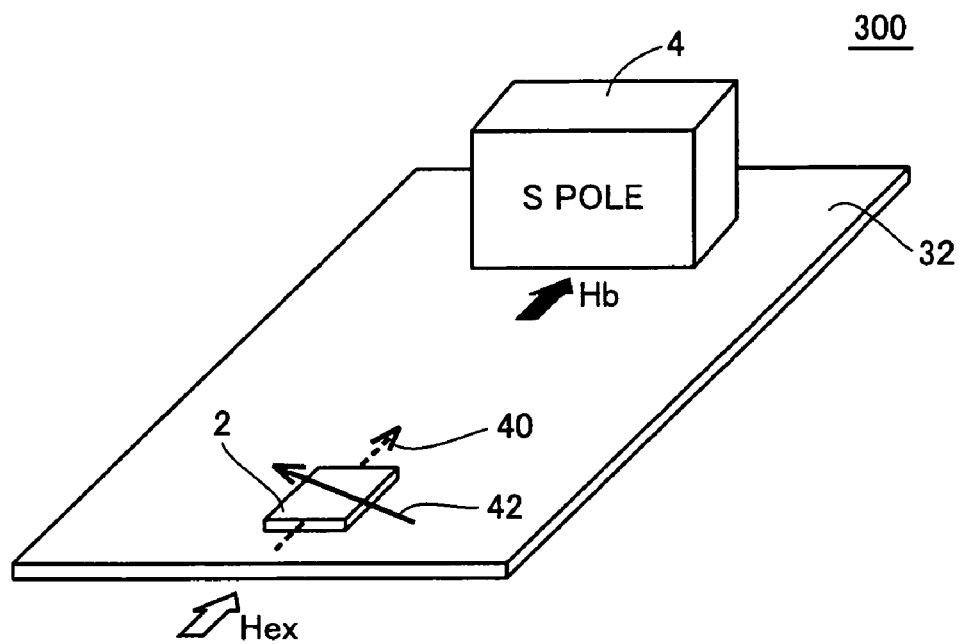
FIGS. 15A and 15B are diagrams showing the substantial portion of a magnetic field detection apparatus according to a third embodiment of the invention.

FIG. 15A is a perspective view showing a magnetic field detection apparatus 300 according to the third embodiment of the invention.

Figure 15B:
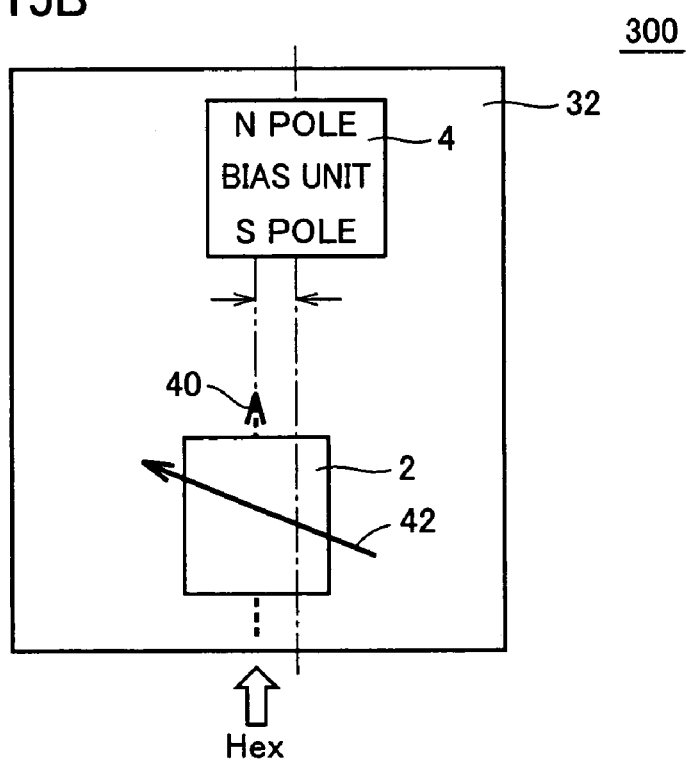

FIG. 15B is a plan view showing magnetic field detection apparatus 300 according to the third embodiment of the invention.

Referring to FIG. 15A, magnetic field detection apparatus 300 includes a magnetoresistance effect element 2 formed on a substrate 32 and a bias unit 4 arranged in opposed relation to magnetoresistance effect element 2.

Referring to FIG. 15B, the center axis of bias unit 4 is arranged in parallel to and in a predetermined spaced relation with the center axis of magnetoresistance effect element 2. Magnetoresistance effect element 2 detects external magnetic field Hex varying in magnitude along the same direction as magnetized vector 40 of the pinned layer.

Figure 16:
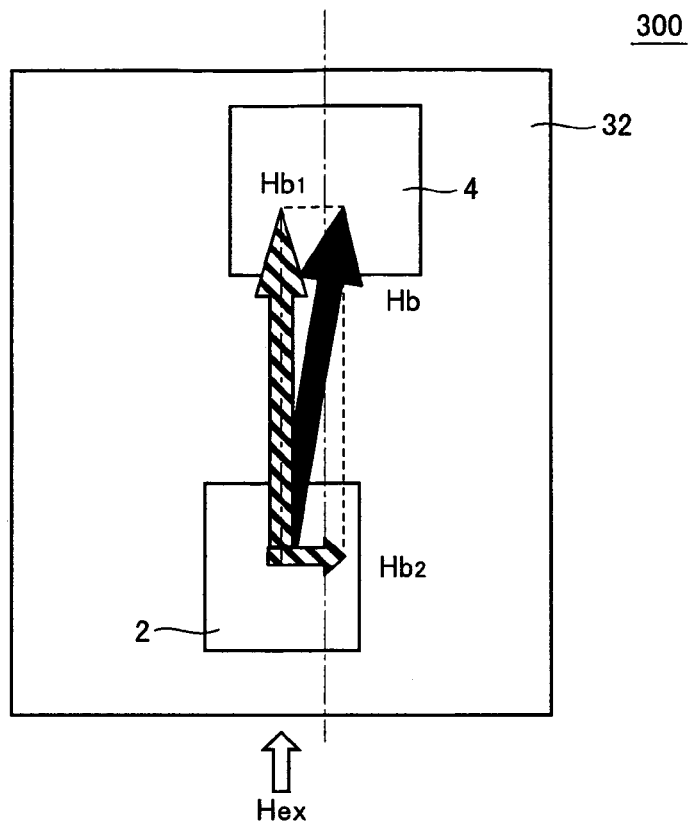
FIG. 16 is a diagram for explaining the bias magnetic field applied to the magnetoresistance effect element of the magnetic field detection apparatus according to the third embodiment of the invention.

Referring to FIG. 16, the center axis of magnetoresistance effect element 2 is spaced by a predetermined distance from the center axis of bias unit 4, and therefore bias magnetic field Hb is applied to magnetoresistance effect element 2 at a predetermined angle to the center axis thereof. With the center axis of magnetoresistance effect element 2 as a reference, bias magnetic field Hb is decomposed into a parallel component Hb1 and an orthogonal component Hb2 perpendicular to each other.

Parallel component Hb1 is parallel to both the center axis of magnetoresistance effect element 2 and external magnetic field Hex. Orthogonal component Hb, on the other hand, is perpendicular to both the center axis of magnetoresistance effect element 2 and external magnetic field Hex.

Referring to FIGS. 15B and 16, magnetized vector 40 of the pinned layer of magnetoresistance effect element 2 in magnetic field detection apparatus 300 is parallel to external magnetic field Hex. Therefore, parallel component Hb1 of bias magnetic field Hb is parallel to external magnetic field Hex, while orthogonal component Hb2 of bias magnetic field Hb is perpendicular to external magnetic field Hex.

Specifically, in view of the fact that external magnetic field Hex, parallel component Hb1 of the bias magnetic field and magnetized vector 40 of the pinned layer of magnetoresistance effect element 2 are parallel to each other. Therefore, the effect of parallel component Hb1 of the bias magnetic field is equivalent to that of the bias magnetic field in magnetic field detection apparatus 100 according to the first embodiment described above.

On the other hand, external magnetic field Hex and magnetized vector 40 of the pinned layer of magnetoresistance effect element 2 are parallel to each other, and parallel component Hb1 of the bias magnetic field is perpendicular to external magnetic field Hex and magnetized vector 40 of the pinned layer of magnetoresistance effect element 2. Therefore, the effect of orthogonal component Hb2 of the bias magnetic field is equivalent to that of the bias magnetic field in magnetic field detection apparatus 200 according to the second embodiment described above.

The change in the detection characteristic by bias magnetic field Hb in magnetic field detection apparatus 300, therefore, is a combination of the shift of the detection range by parallel component Hb1 of the bias magnetic field and the enlargement of the detection range by orthogonal component Hb2 of the bias magnetic field.

Figure 17:
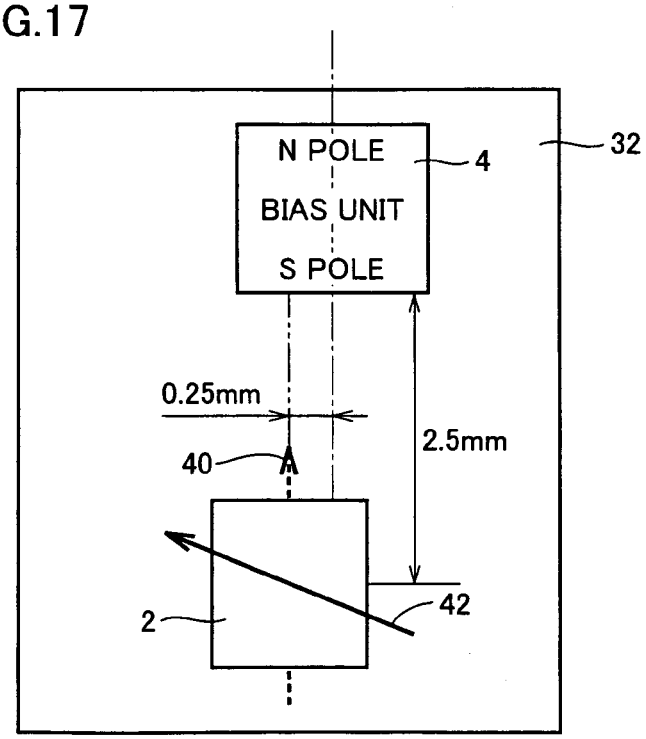
FIG. 17 shows an example of arrangement of the bias unit with respect to the magnetoresistance effect element.

FIG. 17 shows an example of the arrangement of bias unit 4 with respect to magnetoresistance effect element 2. In FIG. 17, the SmCo magnet shown in FIG. 7 is used as bias unit 4.

Referring to FIG. 17, bias unit 4 is arranged in such a manner that the distance between the end side of bias unit 4 and the center point of magnetoresistance effect element 2 on the center axis of magnetoresistance effect element 2 is 2.5 mm and the distance between the center axis of magnetoresistance effect element 2 and the center axis of bias unit 4 is 0.25 mm. Then, parallel component Hb1 of bias magnetic field Hb in magnetoresistance effect element 2 assumes the value of $55 \times 10^3/4\pi$ A/m and orthogonal component Hb2 of bias magnetic field Hb the value of $7 \times 10^3/4\pi$ A/m.

Thus, the relation between external magnetic field Hex and resistance value R in magnetic field detection apparatus 300 is a combination of the detection characteristic of magnetic field detection apparatus 100 according to the first embodiment shown in FIG. 8 and the detection characteristic of magnetic field detection apparatus 200 according to the second embodiment shown in FIG. 14. Specifically, as shown in FIG. 8, the detection range of magnetic field detection apparatus 300 is shifted by $55 \times 10^3/4\pi$ A/m on the one hand, and as shown in FIG. 14, the detection range of magnetic field detection apparatus 300 is enlarged from $\pm 10 \times 10^3/4\pi$ A/m to $\pm 20 \times 10^3/4\pi$ Am on the other hand. As the result of combination of these detection characteristics, therefore, an application of bias magnetic field Hb makes it possible to change the detection range of $-10 \times 10^3/4\pi$ to $10 \times 10^3/4\pi$ A/m to the detection range of $35 \times 10^3/4\pi$ to $75 \times 10^3/4\pi$ A/m in magnetic detection apparatus 300.

As described above, by applying bias magnetic field Hb at a predetermined angle to the center axis of magnetoresistance effect element 2, the detection range of magnetic field detection apparatus 300 can be changed as desired.

The other points are similar to those of the first embodiment and therefore detailed description will not be repeated here.

According to the third embodiment of the invention, the bias magnetic field including a component in the same direction as the external magnetic field and a component perpendicular to the direction of magnetization of the pinned layer of the magnetoresistance effect element is applied by the bias unit, and therefore the effects of both the first and second embodiments can be achieved at the same time. Specifically, a magnetic field detection apparatus is realized in which by setting the optimum bias magnetic field, the detection range can be shifted to the desired area and enlarged to the desired extent in accordance with the variable range of the external magnetic field.

Fourth Embodiment

The first to third embodiments refer to a magnetic field detection apparatus for detecting the external magnetic field utilizing the nonsaturated state in which the ratio of magnetization of the ferromagnetic material constituting the free layer by the external magnetic field is substantially proportional to the magnitude of the external magnetic field. In the fourth embodiment, on the other hand, a magnetic field detection apparatus is explained in which the external magnetic field is detected utilizing the saturated state in which substantially the ferromagnetic material making up the free layer is fully magnetized by the external magnetic field.

Figure 18:
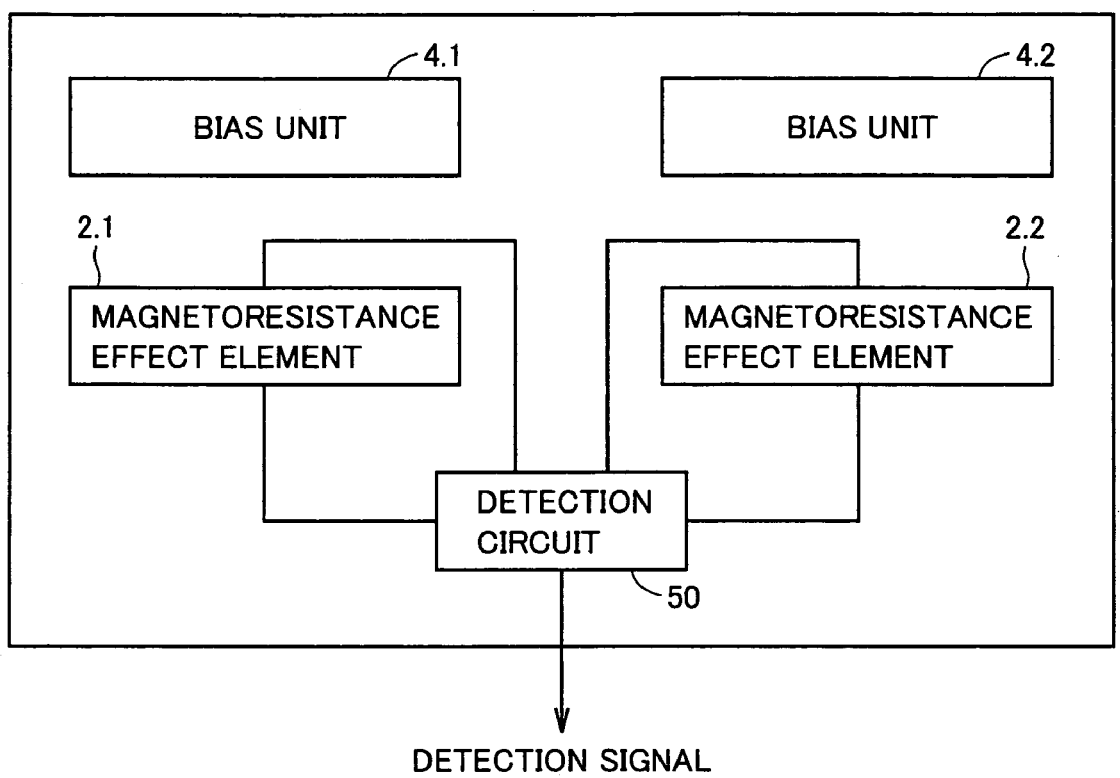
FIG. 18 is a diagram showing a schematic configuration of the magnetic field detection apparatus according to a fourth embodiment of the invention.

Referring to FIG. 18, a magnetic field detection apparatus 400 according to the fourth embodiment of the invention includes magnetoresistance effect elements 2.1 and 2.2, bias units 4.1 and 4.2, and a detection circuit 50.

Magnetoresistance effect elements 2.1 and 2.2 receive the external magnetic field and the bias magnetic field, respectively, and change in resistance value. The other points are similar to those of magnetoresistance effect element 2 according to the first embodiment and therefore detailed description will not be repeated here.

Detection circuit 50 is connected to magnetoresistance effect elements 2.1 and 2.2 and detects the change in resistance value thereof by differential operation by a bridge circuit. Thus, detection circuit 50 outputs the detected change in resistance value as a detection signal.

Bias units 4.1 and 4.2 apply a bias magnetic field to magnetoresistance effect elements 2.1 and 2.2 in a sufficient magnitude to saturate the free layers of magnetoresistance effect elements 2.1 and 2.2, respectively. The other points are similar to those of bias unit 4 according to the first embodiment, and therefore detailed description will not be repeated here.

Figure 19A:
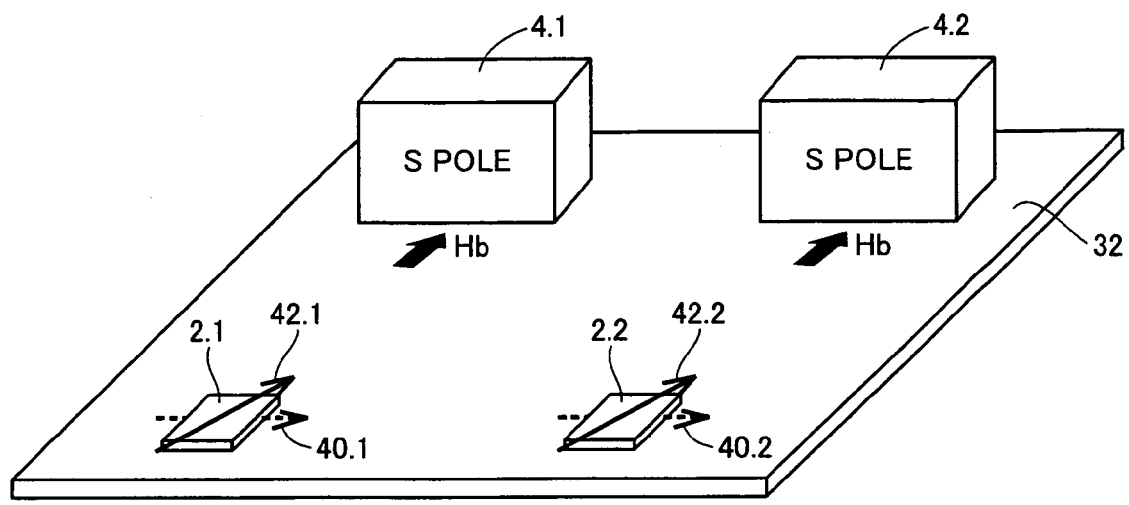
FIGS. 19A and 19B are diagrams showing the substantial portion of a magnetic field detection apparatus according to the fourth embodiment of the invention.

FIG. 19A is a perspective view showing a magnetic field detection apparatus 400.

Figure 19B:
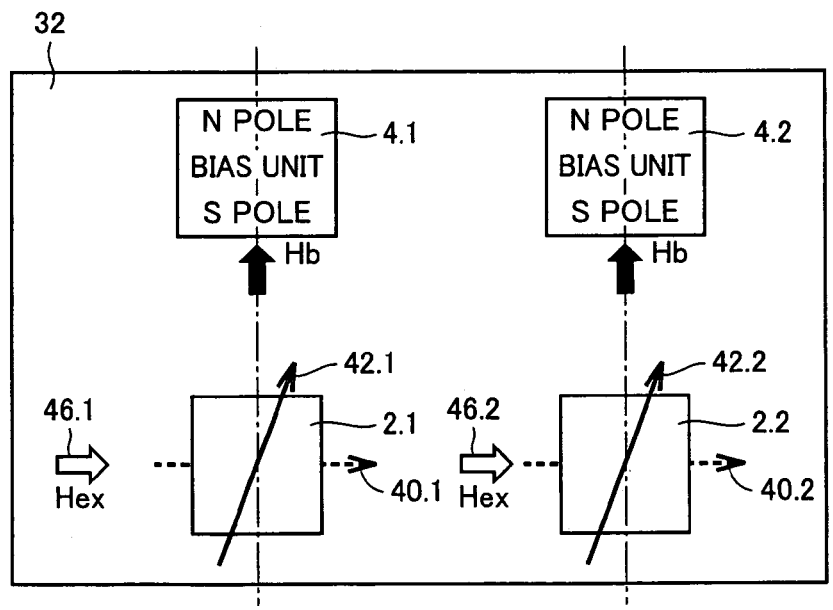

FIG. 19B is a plan view showing magnetic field detection apparatus 400.

Referring to FIG. 19A, magnetic field detection apparatus 400 includes magnetoresistance effect elements 2.1 and 2.2 formed on a substrate 32, and bias units 4.1 and 4.2 arranged in opposed relation to magnetoresistance effect elements 2.1 and 2.2, respectively. In magnetic field detection apparatus 400, bias unit 4.1 is arranged with the center axis thereof aligned with that of magnetoresistance effect element 2.1, and bias unit 4.2 is arranged with the center axis thereof aligned with that of magnetoresistance effect element 2.2. Magnetoresistance effect element 2.1 detects external magnetic field Hex varying in magnitude along the same direction as magnetized vector 40.1 of the pinned layer, while magnetoresistance effect element 2.2 detects external magnetic field Hex varying in magnitude along the same direction as magnetized vector 40.2 of the pinned layer. The external magnetic fields Hex to be detected are the same.

Bias units 4.1 and 4.2 are identical with each other, and so are magnetoresistance effect elements 2.1 and 2.2. Thus, magnetoresistance effect elements 2.1 and 2.2 change in resistance value substantially in the same way under the effect of external magnetic field Hex.

Referring to FIG. 19B, bias unit 4.1 generates bias magnetic field Hb toward bias unit 4.1 from magnetoresistance effect element 2.1 along the line connecting the center of bias unit 4.1 and the center of magnetoresistance effect element 2.1. In similar fashion, bias unit 4.2 generates bias magnetic field Hb toward bias unit 4.2 from magnetoresistance effect element 2.2 along the line connecting the center of bias unit 4.2 and the center of magnetoresistance effect element 2.2.

In magnetoresistance effect element 2.1, magnetized vector 40.1 of the pinned layer is fixed in the direction perpendicular to the line connecting the center of bias unit 4.1 and the center of magnetoresistance effect element 2.1, and magnetized vector 42.1 of the free layer is set at an angle corresponding to external magnetic field Hex and bias magnetic field Hb. In similar manner, magnetized vector 40.2 of the pinned layer is fixed in the direction perpendicular to the line connecting the center of bias unit 4.2 and the center of magnetoresistance effect element 2.2, and magnetized vector 42.2 of the free layer is set at an angle corresponding to external magnetic field Hex and bias magnetic field Hb. Substantially the free layers of magnetoresistance effect elements 2.1 and 2.2 are fully magnetized in the direction of magnetized vectors 42.1 and 42.2 and assume a saturated state.

Figure 20:
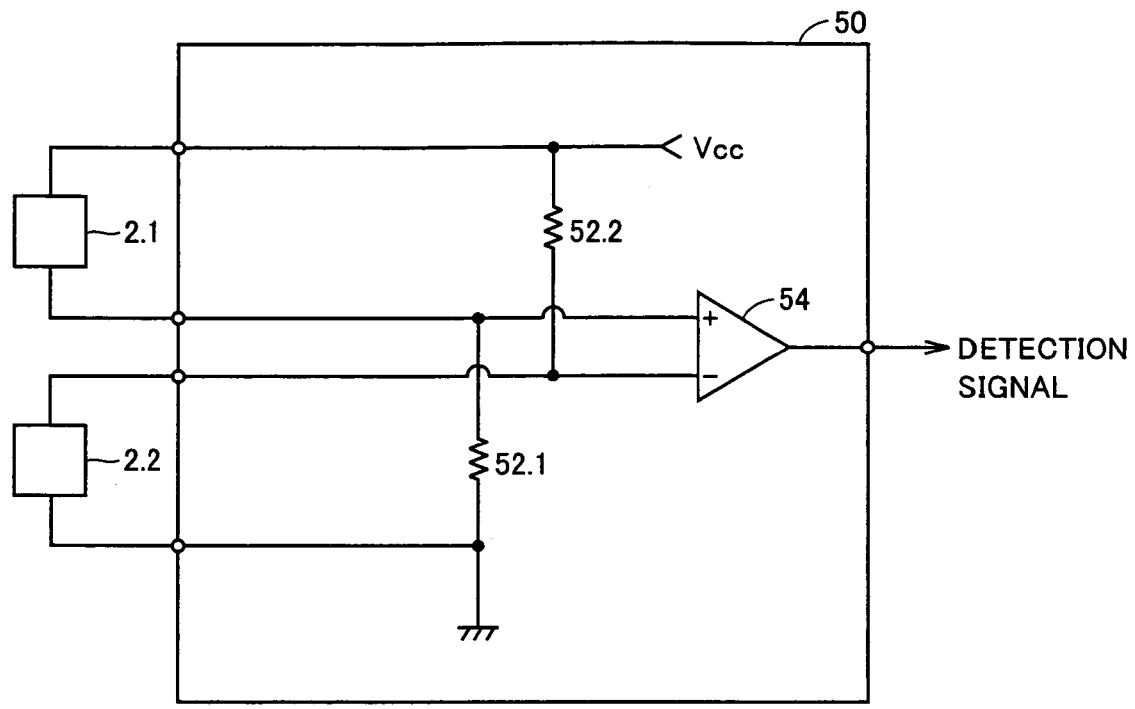
FIG. 20 is a diagram showing a schematic configuration of the detection circuit.

Referring to FIG. 20, detection circuit 50 detects the change in resistance value of magnetoresistance effect elements 2.1 and 2.2 by a bridge circuit, and outputs a detection signal corresponding to the detection result. Detection circuit 50 includes a preamplifier 54 and reference resistors 52.1 and 52.2.

Reference resistors 52.1 and 52.2 have the same resistance value. Reference resistors 52.1 and 52.2 can alternatively be formed of magnetoresistance effect elements with free layers having a fixed direction of magnetization.

An end of reference resistor 52.1 is connected to an end of magnetoresistance effect element 2.1, and the other end of magnetoresistance effect element 2.1 is impressed with a power supply voltage Vcc, while the other end of reference resistor 52.1 is impressed with the grounding voltage.

An end of reference resistor 52.2 is connected to an end of magnetoresistance effect element 2.2, and the other end of reference resistor 52.2 is impressed with a power supply voltage Vcc, while the other end of magnetoresistance effect element 2.2 is impressed with the grounding voltage.

Preamplifier 54 outputs by amplifying, with a predetermined amplification factor, the potential difference between the potential at the connection point between reference resistor 52.1 and magnetoresistance effect element 2.1 and the potential at the connection point between reference resistor 52.2 and magnetoresistance effect element 2.2.

As described above, detection circuit 50 makes up a bridge circuit with magnetoresistance effect elements 2.1 and 2.2 as opposite sides and detects the potential difference thereof As compared with a case in which the resistance value of one magnetoresistance effect element is detected, the detection sensitivity can be almost doubled. Also, the effect of the common mode noise can be reduced.

Figure 21:
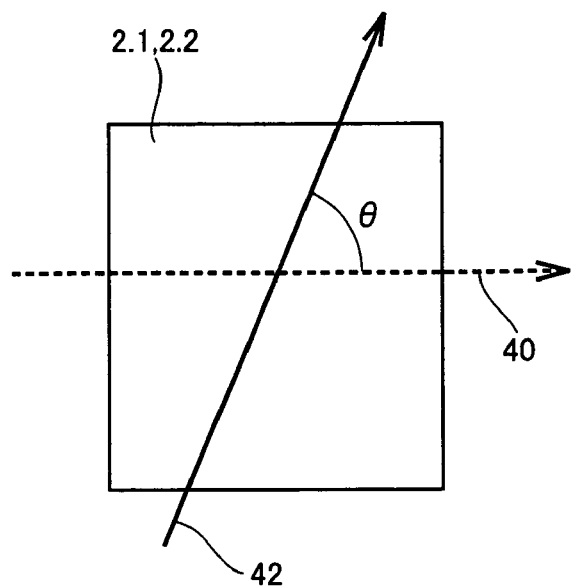
FIG. 21 is a diagram for explaining the change in resistance value of the magnetoresistance effect element with the free layer saturated.

Referring to FIG. 21, resistance value R is expressed by Equation (1) as an angle θ that magnetized vector 40 of the pinned layer forms with magnetized vector 42 of the free layer.

$$R = Rm + R_o \cos\theta \quad (1)$$

Specifically, as long as the free layer is saturated, the resistance value thereof is determined by the angle that magnetized-vector 40 of the pinned layer forms with magnetized vector 42 of the free layer regardless of the magnitude of the external magnetic field. In magnetic field detection apparatus 400, therefore, while maintaining the free layer saturated, resistance value R is detected which changes with angle θ that magnetized vector 42 of the free layer, rotated by the external magnetic field, forms with magnetized vector 40 of the pinned layer.

Figure 22:
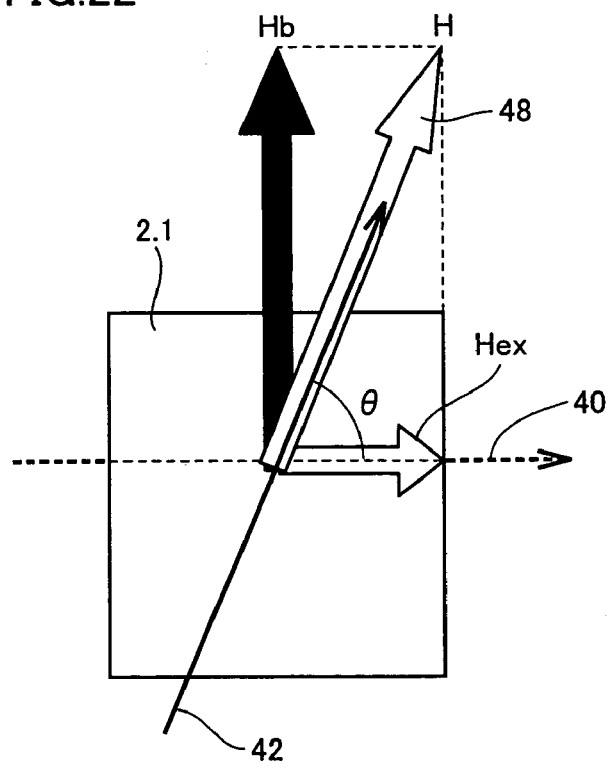
FIG. 22 is a diagram for explaining the bias magnetic field applied to the magnetoresistance effect element of the magnetic field detection apparatus according to the fourth embodiment of the invention.

Referring to FIG. 22, the center axis of bias unit 4.1 is aligned with that of magnetoresistance effect element 2.1, and therefore magnetoresistance effect element 2.1 is applied bias magnetic field Hb parallel to the center axis thereof. Also, magnetoresistance effect element 2.1 is applied external magnetic field Hex varying in magnitude along the direction perpendicular to the line connecting the center of bias unit 4.1 and the center of magnetoresistance effect element 2.1.

In view of the fact that magnetoresistance effect element 2.1 is applied bias magnetic field Hb and external magnetic field Hex orthogonal to each other, the angle θ that a combined magnetic field H forms with magnetized vector 40.1 of the pinned layer is expressed by Equation (2).

$$\theta = \tan^{-1}(Hb/Hex) \quad (2)$$

Substituting Equation (2) into Equation (1), resistance value R of magnetoresistance effect element 2.1 is expressed by Equation (3).

$$R = Rm + R_o \cos(\tan^{-1}(Hb/Hex)) \quad (3)$$

From Equation (3), resistance value R of magnetoresistance effect element 2.1 can be expressed by a function including external magnetic field Hex, and therefore magnetic field detection apparatus 400 can detect external magnetic field Hex based on the change in resistance value R.

Magnetoresistance effect element 2.2 is similar to magnetoresistance effect element 2.1 and therefore detailed description will not be repeated here.

As understood from Equation (3), the changing rate (sensitivity) of the resistance value of magnetoresistance effect elements 2.1 and 2.2 is determined by the relation between the magnitude of external magnetic field Hex and the magnitude of bias magnetic field Hb.

Figure 23B:
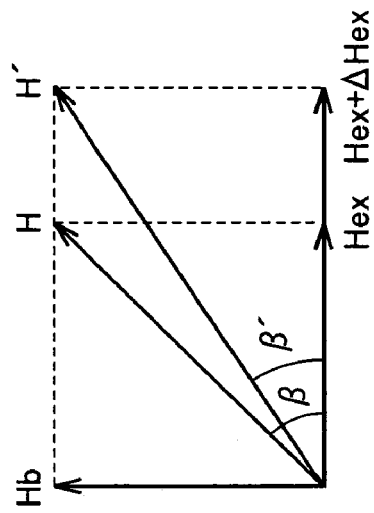
FIGS. 23A and 23B are diagrams for explaining the change in sensitivity of the magnetic field detection apparatus according to the fourth embodiment of the invention.
Figure 23A:
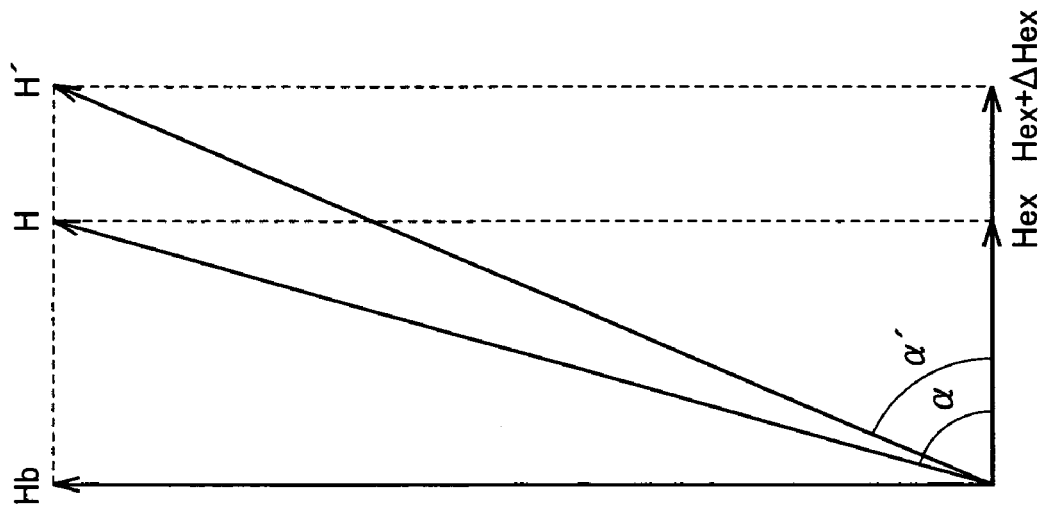

FIG. 23A shows a case where bias magnetic field Hb is relatively larger than external magnetic field Hex.

FIG. 23B shows a case where bias magnetic field Hb smaller than the bias magnetic field shown in FIG. 23A is applied.

Referring to FIG. 23A, in the case where external magnetic field Hex and bias magnetic field Hb are applied to magnetoresistance effect elements 2.1 and 2.2, assume that the angle between the combined magnetic field H and the magnetized vector of the pinned layer is α, and that the angle between the combined magnetic field H', corresponding to an increase of ΔHex on external magnetic field Hex, and the magnetized vector of the pinned layer is α'.

Referring to FIG. 23B, assume that external magnetic field Hex identical to the external magnetic field in FIG. 23A and bias magnetic field Hb smaller than the bias magnetic field in FIG. 23A are applied to magnetoresistance effect elements 2.1 and 2.2, and that the combined magnetic field H forms an angle β with the magnetized vector of the pinned layer. Also, assume that the angle that the combined magnetic field H', corresponding to an increase of the same ΔHex as in FIG. 23A on the external magnetic field Hex, forms with the magnetized vector of the pinned layer is β'.

Referring to FIGS. 23A and 23B, the change from angle β to β' is larger than the variation from angle α to α' (β−β'>α−α'). This indicates that the sensitivity of magnetic field detection apparatus 400 in FIG. 23B is higher than the sensitivity in FIG. 23A. Specifically, even in the case where external magnetic field Hex undergoes the same variation ΔHex, the sensitivity of magnetic field detection apparatus 400 can be adjusted in accordance with the correlation with bias magnetic field Hb.

By setting bias magnetic field Hb corresponding to the variable range of external magnetic field Hex, therefore, the sensitivity of magnetic field detection apparatus 400 can be adjusted and the proper detection range can be realized.

According to the fourth embodiment of the invention, the bias unit applies a bias magnetic field in the direction perpendicular to the external magnetic field, and the magnetoresistance effect element receives the combined magnetic field of the external magnetic field and the bias magnetic field. The free layer of the magnetoresistance effect element is saturated with the combined magnetic field and generates a magnetized vector in the direction of the combined magnetic field. Further, the detection sensitivity of the resistance value of the external magnetic field changes in accordance with the relation between the magnitude of the bias magnetic field and the magnitude of the external magnetic field. As a result, a magnetic field detection apparatus is realized in which the detection range can be adjusted as desired in accordance with the variable range of the external magnetic field.

Also, according to the fourth embodiment of the invention, the bias unit applies the bias magnetic field in the direction perpendicular to the external magnetic field, and therefore the components of the combined magnetic field can be decomposed into elements independent of each other. Regardless of the magnitude of the external magnetic field, therefore, the bias magnetic field can be maintained at a predetermined ratio and therefore the detection characteristic of the resistance value within the detection range can be linearized.

Further, according to the fourth embodiment of the invention, two magnetoresistance effect elements are used and the change in resistance value thereof is detected by a bridge circuit. Therefore, the reference current and the reference voltage can be eliminated. Also, in view of the fact that the detection sensitivity can be doubled, the external magnetic field can be detected with higher accuracy. Further, since the noises in phase can be offset, the detection error can be suppressed.

Fifth Embodiment

The fourth embodiment described above refers to a configuration for detecting the external magnetic field in the same direction as the direction of magnetization of the pinned layer of a magnetoresistance effect element. The fifth embodiment, on the other hand, refers to a configuration for detecting the external magnetic field in the direction perpendicular to the direction of magnetization of the pinned layer of a magnetoresistance effect element.

The schematic configuration of a magnetic field detection apparatus 500 according to the fifth embodiment of the invention is similar to that of magnetic field detection apparatus 400 according to the fourth embodiment shown in FIG. 18, and therefore the detailed description will not be repeated here.

Figure 24A:
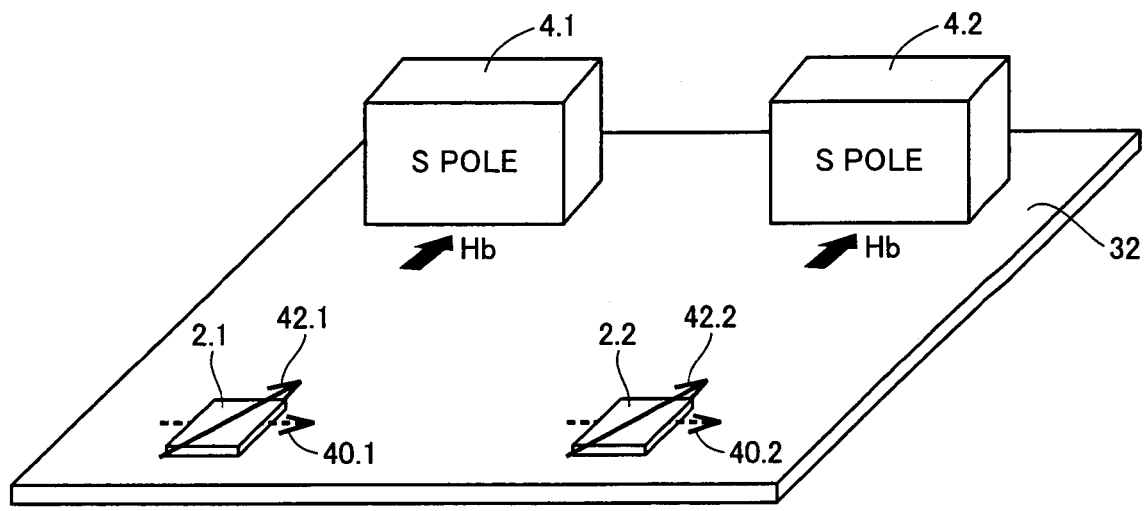
FIGS. 24A and 24B are diagrams showing the substantial portion of the magnetic field detection apparatus according to a fifth embodiment of the invention.

FIG. 24A is a perspective view showing magnetic field detection apparatus 500 according to the fifth embodiment of the invention.

Figure 24B:
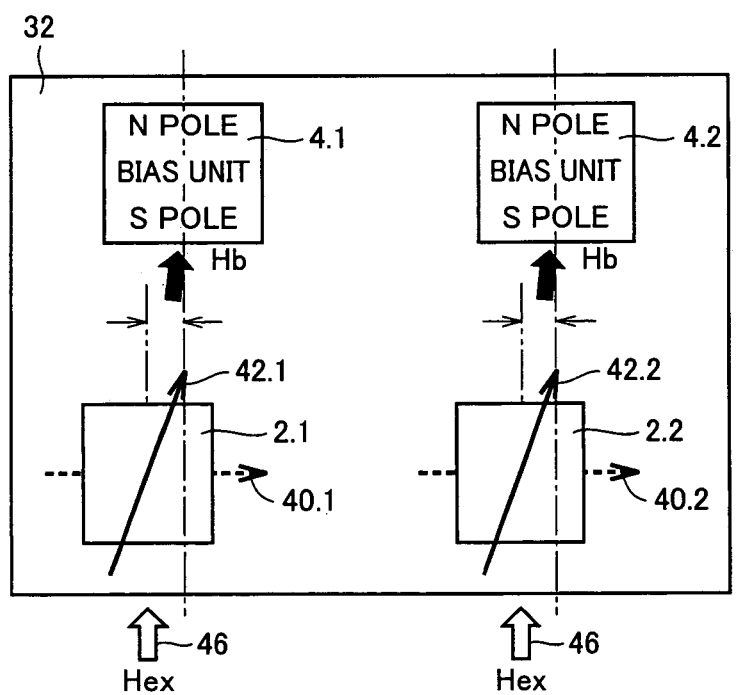

FIG. 24B is a plan view showing magnetic field detection apparatus 500 according to the fifth embodiment of the invention.

Referring to FIG. 24A, magnetic field detection apparatus 500 includes magnetoresistance effect elements 2.1 and 2.2 formed on a substrate 32, and bias units 4.1 and 4.2 arranged in opposed relation to magnetoresistance effect elements 2.1 and 2.2, respectively.

Referring to FIG. 24B, bias unit 4.1, having the center axis parallel to that of magnetoresistance effect element 2.1, is arranged in predetermined spaced relation with magnetoresistance effect element 2.1. In similar fashion, bias unit 4.2, having the center axis parallel to that of magnetoresistance effect element 2.2, is arranged in predetermined spaced relation with magnetoresistance effect element 2.2. Magnetoresistance effect elements 2.1 and 2.2 detect external magnetic field Hex varying in magnitude along the same direction as magnetized vectors 40.1 and 40.2, respectively, of the pinned layer. The external magnetic fields Hex to be detected are the same.

In magnetoresistance effect element 2.1, magnetized vector 40.1 of the pinned layer is fixed in the direction perpendicular to the center axis of bias unit 4.1 and the center axis of magnetoresistance effect element 2.1, while magnetized vector 42.1 of the free layer is set at an angle corresponding to external magnetic field Hex and bias magnetic field Hb. In similar fashion, magnetized vector 40.2 of the pinned layer is fixed in the direction perpendicular to the center axis of bias unit 4.2 and the center axis of magnetoresistance effect element 2.2, and magnetized vector 42.2 of the free layer is set at an angle corresponding to external magnetic field Hex and bias magnetic field Hb. Substantially the free layers of magnetoresistance effect elements 2.1 and 2.2 are fully magnetized in the directions of magnetized vectors 42.1 and 42.2, respectively, and assume a saturated state.

Also, bias units 4.1 and 4.2 are identical with each other in structure, and so are magnetoresistance effect elements 2.1 and 2.2. Thus, magnetoresistance effect elements 2.1 and 2.2 change in resistance value substantially in the same way under the effect of external magnetic field Hex.

Figure 25:
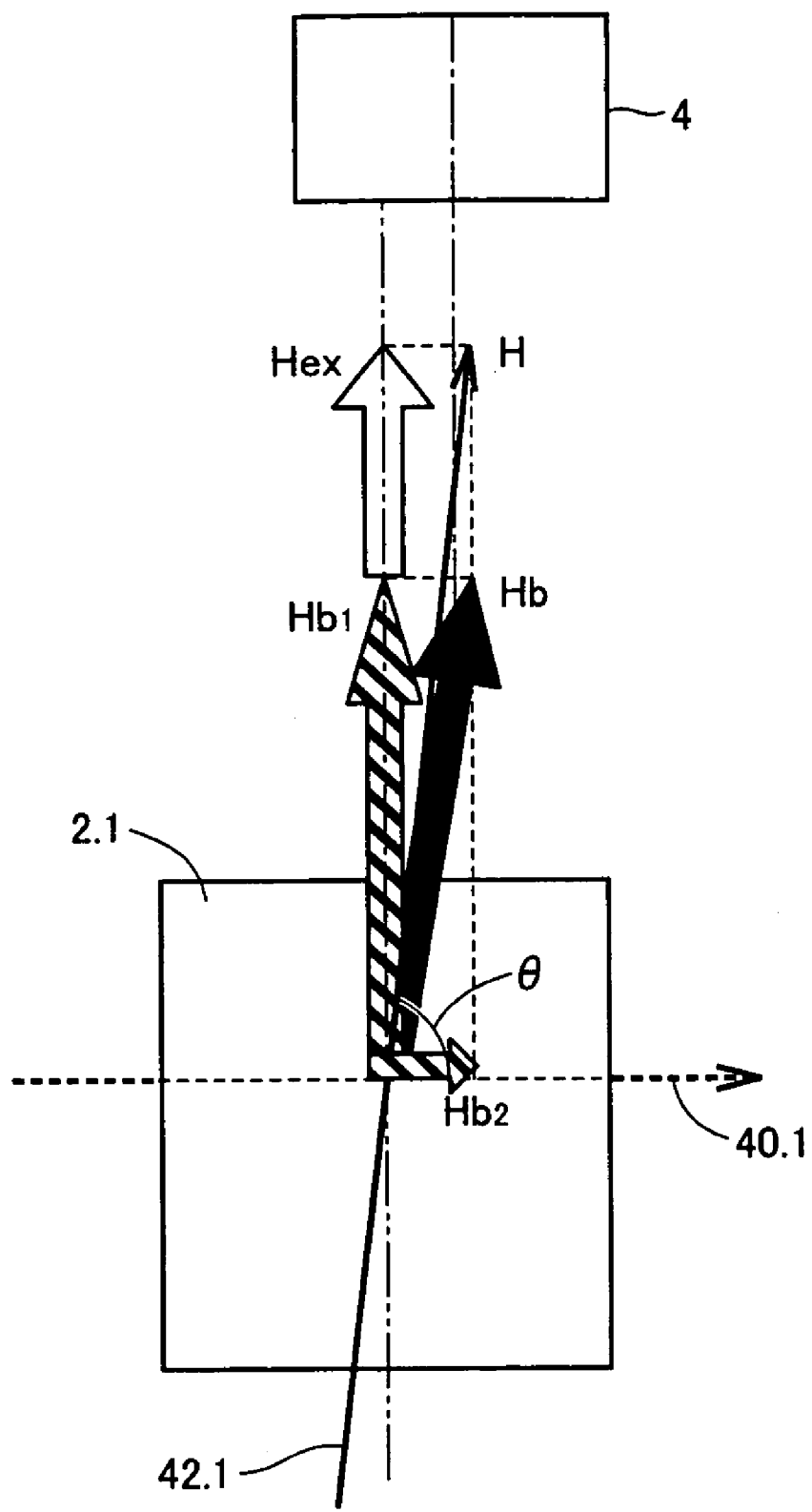
FIG. 25 is a diagram for explaining the bias magnetic field applied to the magnetoresistance effect element of the magnetic field detection apparatus according to the fifth embodiment of the invention.

Referring to FIG. 25, the center axis of magnetoresistance effect element 2.1 is spaced by a predetermined distance from the center axis of bias unit 4.1, and therefore bias magnetic field Hb is applied to magnetoresistance effect element 2.1 at a predetermined angle to the center axis thereof. With the center axis of magnetoresistance effect element 2.1 as a reference, bias magnetic field Hb is decomposed into a parallel component Hb1 and an orthogonal component Hb2 perpendicular to each other.

Parallel component Hb1 is parallel to both the center axis of magnetoresistance effect element 2.1 and external magnetic field Hex. Orthogonal component Hb2 is perpendicular to both the center axis of magnetoresistance effect element 2.1 and external magnetic field Hex.

A combined magnetic field H of bias magnetic field Hb and external magnetic field Hex, therefore, is configured of a component including parallel component Hb1 of bias magnetic field Hb and external magnetic field Hex on the one hand and an orthogonal component Hb2 of bias magnetic field Hb on the other hand. An angle θ that magnetized vector 42.1 (combined magnetic field H) of the free layer forms with magnetized vector 40.1 of the pinned layer is expressed by Equation (4).

$$\theta = \tan^{-1}((Hb1+Hex)/Hb2) \tag{4}$$

Substituting Equation (4) into Equation (1), resistance value R of magnetoresistance effect element 2.1 is expressed by Equation (5).

$$R = Rm + R_o \cos(\tan^{-1}((Hb1+Hex)/Hb2)) \tag{5}$$

From Equation (5), resistance value R of magnetoresistance effect element 2.1 can be expressed by a function including external magnetic field Hex, and therefore magnetic field detection apparatus 500 can detect external magnetic field Hex based on the change in resistance value R.

Magnetoresistance effect element 2.2 is similar to magnetoresistance effect element 2.1 and therefore detailed description will not be repeated here.

Further, it is understood from Equation (5) that the changing rate (sensitivity) of the resistance value of magnetoresistance effect elements 2.1 and 2.2 is determined by the relation between the magnitude of parallel component Hb1 of bias magnetic field Hb and external magnetic field Hex and orthogonal component Hb2 of bias magnetic field Hb. By setting the magnitude and direction of bias magnetic field Hb applied to magnetoresistance effect elements 2.1 and 2.2 appropriately, therefore, the detection range of magnetic field detection apparatus 500 can be adjusted.

Specifically, by appropriately setting the position of bias units 4.1 and 4.2 relative to magnetoresistance effect elements 2.1 and 2.2, the detection range of magnetic field detection apparatus 500 can be arbitrarily changed.

In magnetic field detection apparatus 500, substantially the same external magnetic field Hex is applied to magnetoresistance effect elements 2.1 and 2.2 thereby to detect external magnetic field Hex. Thus, magnetic field detection apparatus 500 is applicable to a current detection circuit as described below.

Figure 26:
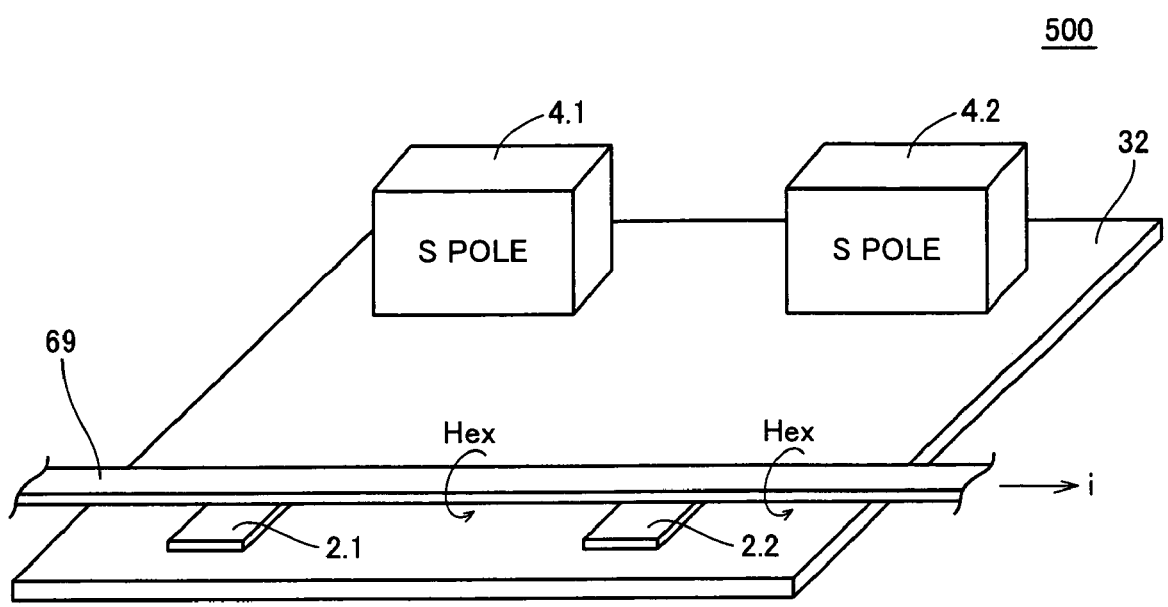
FIG. 26 is a diagram showing the substantial portion of a current detection circuit using a magnetic field detection circuit according to the fifth embodiment.

Referring to FIG. 26, a current path 69 in which the current to be detected flows is arranged above magnetoresistance effect elements 2.1 and 2.2. The current to be detected flowing in current path 69 generates an electromagnetic field in the circuit direction of current path 69 which has a magnitude uniform along current path 69. This electromagnetic field is proportional to the magnitude of the current to be detected, and therefore, the magnitude of the current can be measured by detecting the electromagnetic field.

As described, therefore, magnetic field detection apparatus 500 detects external magnetic field Hex generated by the current to be detected, flowing in current path 69 and measures the current based on external magnetic field Hex thus detected.

According to the fifth embodiment of the invention, the magnetoresistance effect elements receive a combined magnetic field of the external magnetic field and the bias magnetic field. The free layer of the magnetoresistance effect elements is saturated with the combined magnetic field and generates a magnetized vector in the direction of the combined magnetic field. Further, the detection sensitivity of the resistance value to the external magnetic field changes in accordance with the relation between the magnitude of the bias magnetic field and the magnitude of the external magnetic field. Thus, a magnetic field detection apparatus can be realized in which the detection range can be adjusted as desired in accordance with the variable range of the external magnetic field by setting the optimum bias magnetic field.

Sixth Embodiment

The fourth and fifth embodiments refer to a configuration in which each of a plurality of magnetoresistance effect elements is applied a bias magnetic field from a corresponding bias unit. The sixth embodiment, on the other hand, refers to a configuration in which the same bias unit applies a bias magnetic field to a plurality of magnetoresistance effect elements.

Figure 27:
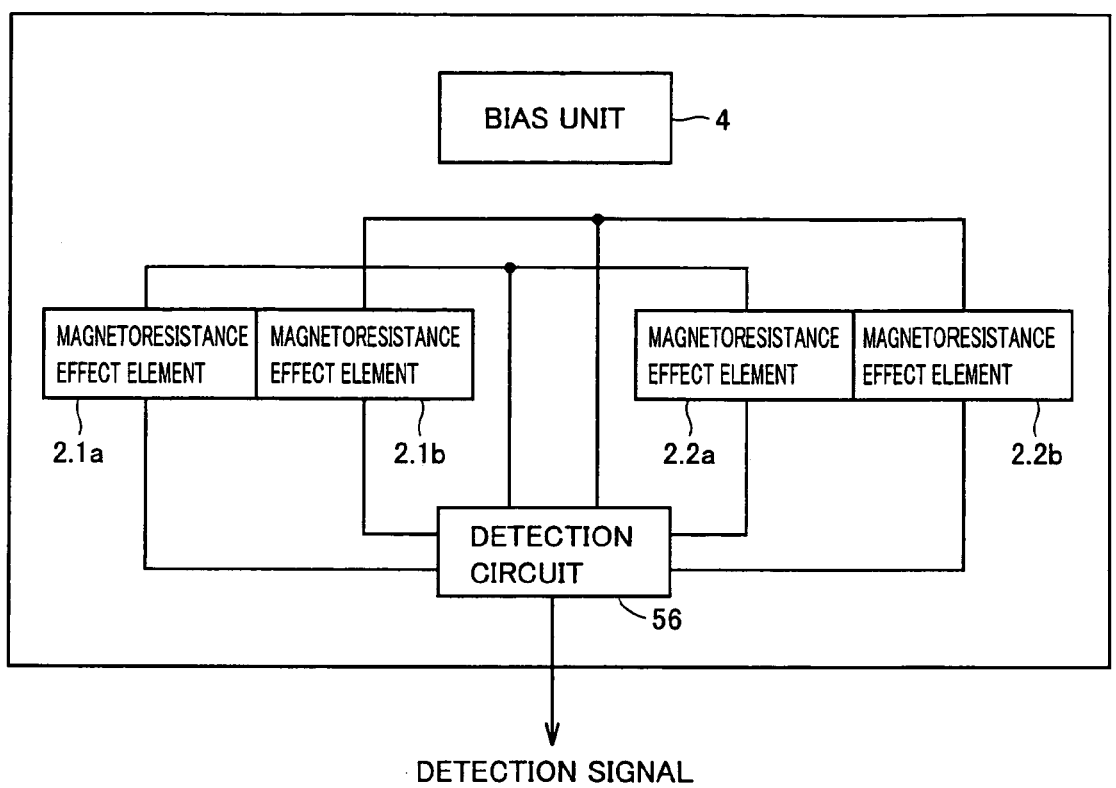
FIG. 27 is a diagram showing a schematic configuration of a magnetic field detection apparatus according to a sixth embodiment of the invention.

Referring to FIG. 27, a magnetic field detection apparatus 600 according to the sixth embodiment of the invention includes magnetoresistance effect elements 2.1a, 2.1b, 2.2a, and 2.2b, a bias unit 4 and a detection circuit 56.

Magnetoresistance effect elements 2.1a, 2.1b, 2.2a and 2.2b have the same structure. Magnetoresistance effect elements 2.1a and 2.1b are arranged in proximity to each other, and so are magnetoresistance effect elements 2.2a and 2.2b. Therefore, the resistance values of magnetoresistance effect elements 2.1a and 2.1b are changed equally by receiving the external magnetic field and the bias magnetic field, and so are the resistance values of magnetoresistance effect elements 2.2a and 2.2b. The other points are similar to those of magnetoresistance effect element 2 according to the first embodiment and therefore detailed description will not be repeated here.

Detection circuit 56 constitutes a bridge circuit including magnetoresistance effect elements 2.1a and 2.2a connected in series and magnetoresistance effect elements 2.1b and 2.2b connected in series. Detection circuit 56 executes differential operation between the resistance values of series circuits, detects the change in resistance value thereof and outputs the detected result as a detection signal.

Bias unit 4 applies a bias magnetic field to magnetoresistance effect elements 2.1a, 2.1b, 2.2a and 2.2b in a sufficient magnitude to saturate the free layer of each of magnetoresistance effect elements 2.1a, 2.1b, 2.2a and 2.2b. The other points are similar to those of bias unit 4 according to the first embodiment, and therefore detailed description will not be repeated here.

Figure 28:
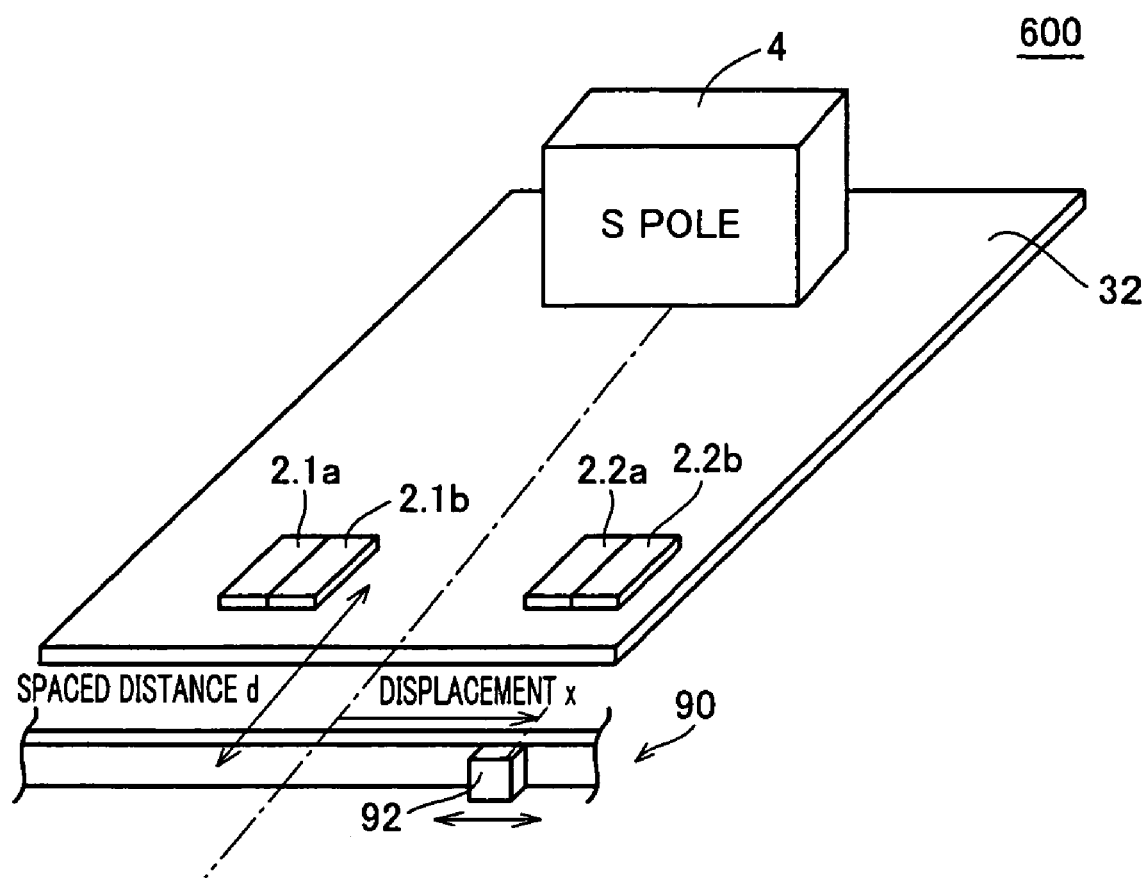
FIG. 28 is a diagram showing the substantial portion of the magnetic field detection apparatus according to the sixth embodiment of the invention.

Referring to FIG. 28, magnetic detection apparatus 600 includes a bias unit 4 formed on a substrate 32, magnetoresistance effect elements 2.1a and 2.1b and magnetoresistance effect elements 2.2a and 2.2b arranged symmetrically about the center axis of bias unit 4.

Magnetic field detection apparatus 600 detects the displacement of a magnetic field generating unit 92 added to a mobile unit linearly moved in the direction perpendicular to the center axis of bias unit 4. Specifically, magnetic field detection apparatus 600 detects the displacement of magnetic field generating unit 92 based on the difference in resistance value caused by the difference between the external magnetic field received by magnetoresistance effect elements 2.1a, 2.1b and the external magnetic field received by magnetoresistance effect elements 2.2a, 2.2b in accordance with the position of magnetic field generating unit 92 for generating external magnetic field Hex.

Figure 29:
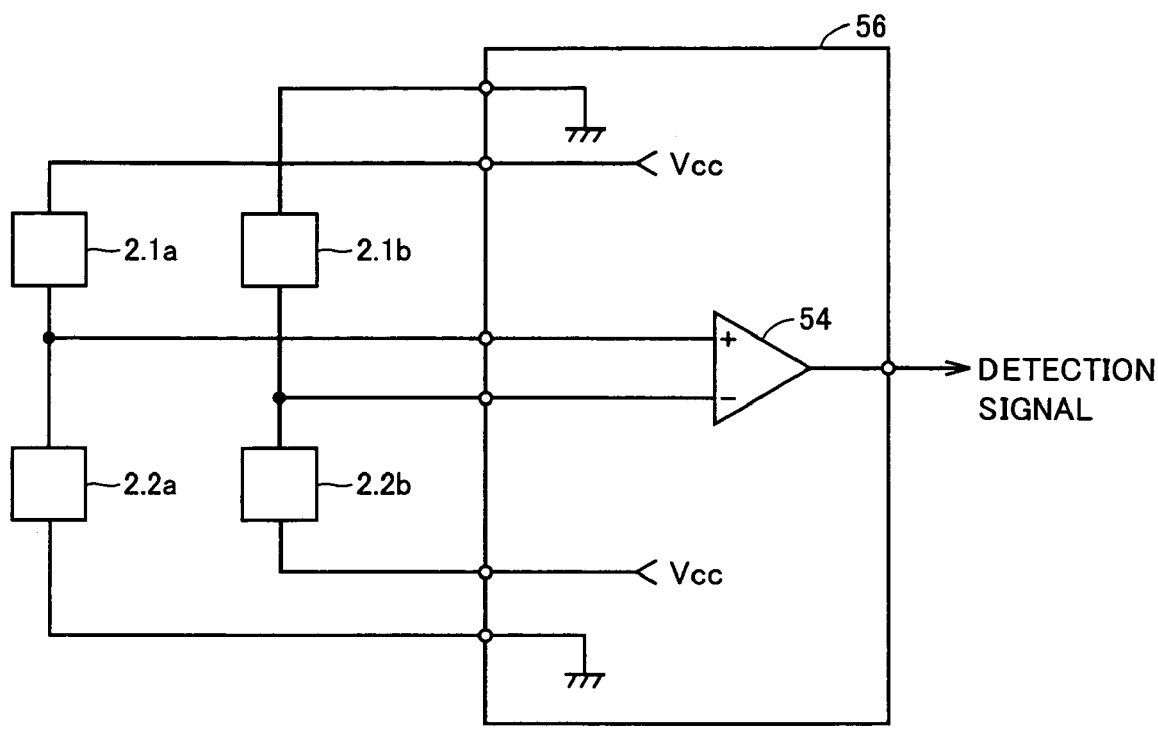
FIG. 29 is a diagram showing a schematic configuration of the detection circuit.

Referring to FIG. 29, detection circuit 56 detects the change in resistance value of magnetoresistance effect elements 2.1a, 2.2a and 2.2a, 2.2b by a bridge circuit, and outputs a detection signal corresponding to the detection result. Detection circuit 56 also includes a preamplifier 54.

An end of magnetoresistance effect element 2.1a is connected to an end of magnetoresistance effect element 2.2a. The other end of magnetoresistance effect element 2.1a is impressed with a power supply voltage Vcc, and the other end of magnetoresistance effect element 2.2a is impressed with the grounding voltage.

An end of magnetoresistance effect element 2.1b is connected to an end of magnetoresistance effect element 2.2b. The other end of magnetoresistance effect element 2.2b is impressed with a power supply voltage Vcc, and the other end of magnetoresistance effect element 2.1b is impressed with the grounding voltage.

Preamplifier 54 outputs by amplifying, with a predetermined amplification factor, the difference between the potential at the connection point of magnetoresistance effect elements 2.1a and 2.2a and the potential at the connection point of magnetoresistance effect elements 2.2b and 2.2b.

As described above, detection circuit 56 makes up a bridge circuit having a first pair of opposite sides including magnetoresistance effect elements 2.1a and 2.1b and a second pair of opposite sides including magnetoresistance effect element 2.2a and 2.2b, and detects the potential difference between them. Therefore, the change in resistance value of magnetoresistance effect elements 2.2a and 2.2b with respect to magnetoresistance effect elements 2.1a and 2.1b can be detected without any reference resistor.

Figure 30:
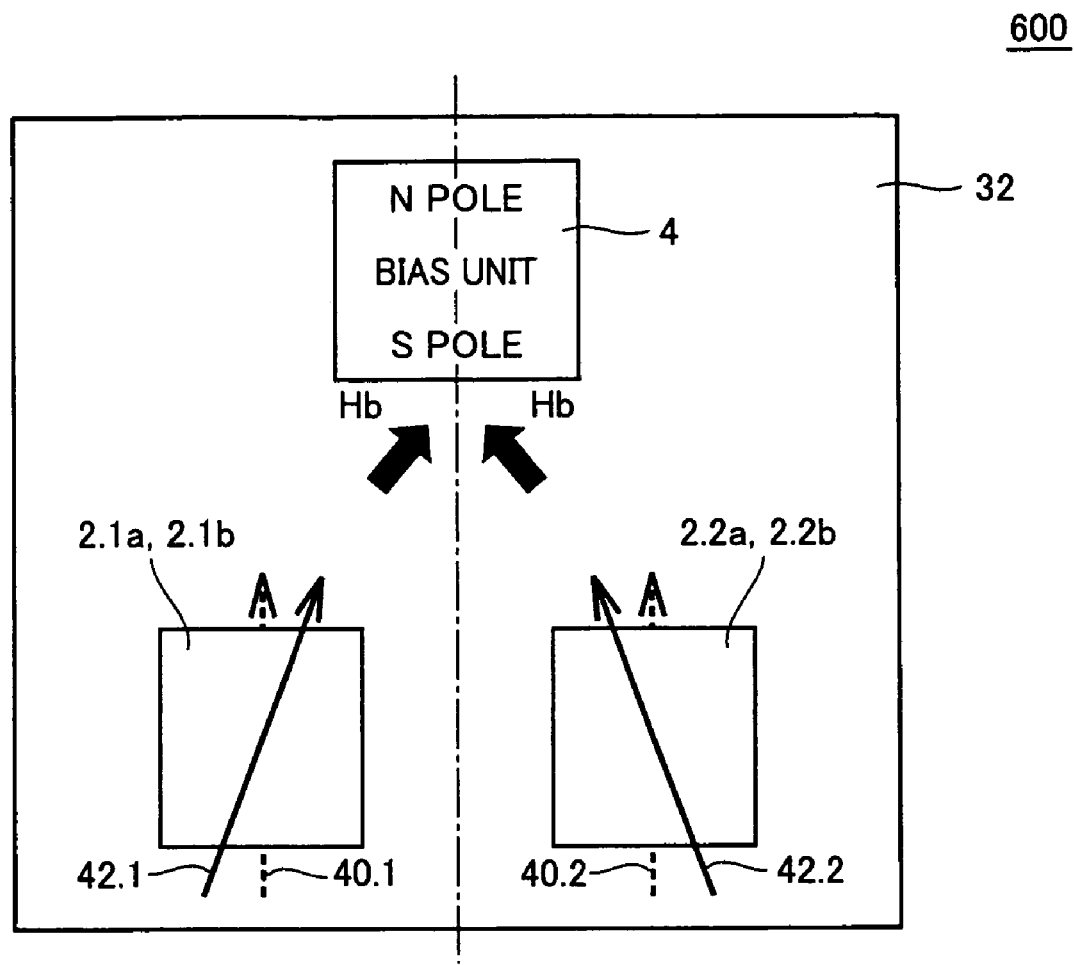
FIG. 30 is a diagram for explaining the external magnetic field and the bias magnetic field applied to the magnetoresistance effect element of the magnetic field detection apparatus according to the sixth embodiment of the invention.

Referring to FIG. 30, the distance between magnetoresistance effect element 2.1a and magnetoresistance effect element 2.1b is sufficiently smaller than the distance from magnetoresistance effect elements 2.1a and 2.1b to bias unit 4 and magnetoresistance effect elements 2.2a and 2.2b. Therefore, bias magnetic field Hb and external magnetic field Hex are considered to have an equal effect on magnetoresistance effect elements 2.1a and 2.1b. In similar fashion, bias magnetic field Hb and external magnetic field Hex are considered to have an equal effect on magnetoresistance effect elements 2.2a and 2.2b. Thus, the pair of magnetoresistance effect elements 2.1a and 2.1b and the pair of magnetoresistance effect elements 2.2a and 2.2b can be regarded as two equivalent magnetoresistance effect elements, respectively.

In magnetoresistance effect elements 2.1a and 2.1b, magnetized vector 40.1 of the pinned layer is fixed in the direction parallel to the center axis of bias unit 4, and magnetized vector 42.1 of the free layer is set at an angle corresponding to external magnetic field Hex and bias magnetic field Hb. In similar fashion, in magnetoresistance effect elements 2.2a and 2.2b, magnetized vector 40.2 of the pinned layer is fixed in the direction parallel to the center axis of bias unit 4, and magnetized vector 42.2 of the free layer is set at an angle corresponding to external magnetic field Hex and bias magnetic field Hb. Substantially the free layers of magnetoresistance effect elements 2.1a, 2.1b and 2.2a, 2.2b are fully magnetized in the direction of magnetized vectors 42.1 and 42.2 and saturated, respectively.

Also, the pair of magnetoresistance effect elements 2.1a and 2.1b and the pair of magnetoresistance effect elements 2.2a and 2.2b are arranged symmetrically with respect to each other about the center axis of bias unit 4. As a result, bias magnetic field Hb applied to the pair of magnetoresistance effect elements 2.1a and 2.1b and the pair of magnetoresistance effect elements 2.2a and 2.2b are symmetrical about the center axis of bias unit 4. Unless external magnetic field Hex is applied, therefore, the angle that magnetized vector 40.1 of the pinned layer forms with magnetized vector 42.1 of the free layer in magnetoresistance effect elements 2.1a and 2.1b coincides with the angle that magnetized vector 40.2 of the pinned layer forms with magnetized vector 42.2 of the free layer in magnetoresistance effect elements 2.2a and 2.2b.

The resistance value generated by magnetoresistance effect elements 2.1a and 2.1b is substantially the same as that generated by magnetoresistance effect elements 2.2a and 2.2b, so that the output voltage of the bridge circuit is substantially zero.

Next, upon application of external magnetic field Hex to magnetoresistance effect elements 2.1a, 2.1b and 2.2b, 2.2b, like in magnetic field detection apparatus 400 according to the fourth embodiment and magnetic field detection apparatus 500 according to the fifth embodiment, the direction of magnetized vectors 42.1 and 42.2 of the free layer is changed. As a result, the resistance values of magnetoresistance effect elements 2.1a, 2.1b and 2.2a, 2.2b also undergo a change.

Referring to FIG. 28 again, external magnetic fields Hex of different magnitudes are applied to the pair of magnetoresistance effect elements 2.1a and 2.1b and the pair of magnetoresistance effect elements 2.2a and 2.2b in accordance with the displacement of magnetic field generating unit 92 added to mobile unit 90 adapted to move linearly. As a result, the difference in resistance value develops between the pair of magnetoresistance effect elements 2.1a and 2.1b and the pair of magnetoresistance effect elements 2.2a and 2.2b.

Referring to FIG. 30 again, assume that magnetic field generating unit 92 approaches the magnetoresistance effect element pair 2.1a, 2.1b. A larger external magnetic field is applied to magnetoresistance effect element pair 2.1a, 2.1b. Then, the direction of magnetized vector 42.1 of the free layers of magnetoresistance effect elements 2.1a and 2.1b is changed by external magnetic field Hex, and the angle with magnetized vector 40.1 of the pinned layer is reduced as compared with the angle that magnetized vector 42.2 of the free layer of magnetoresistance effect element pair 2.2a, 2.2b forms with magnetized vector 40.2 of the pinned layer.

Further, in the case where magnetic field generating unit 92 moves and approaches magnetoresistance effect element pair 2.2a, 2.2b, a larger external magnetic field is applied to magnetoresistance effect element pair 2.2a, 2.2b. Then, the direction of magnetized vector 42.2 of the free layers of magnetoresistance effect elements 2.2a and 2.2b is changed by external magnetic field Hex. Thus, the angle with magnetized vector 40.2 of the pinned layer is reduced as compared with the angle that magnetized vector 42.1 of the free layer of magnetoresistance effect element pair 2.1a, 2.1b forms with magnetized vector 40.1 of the pinned layer.

Figure 31:
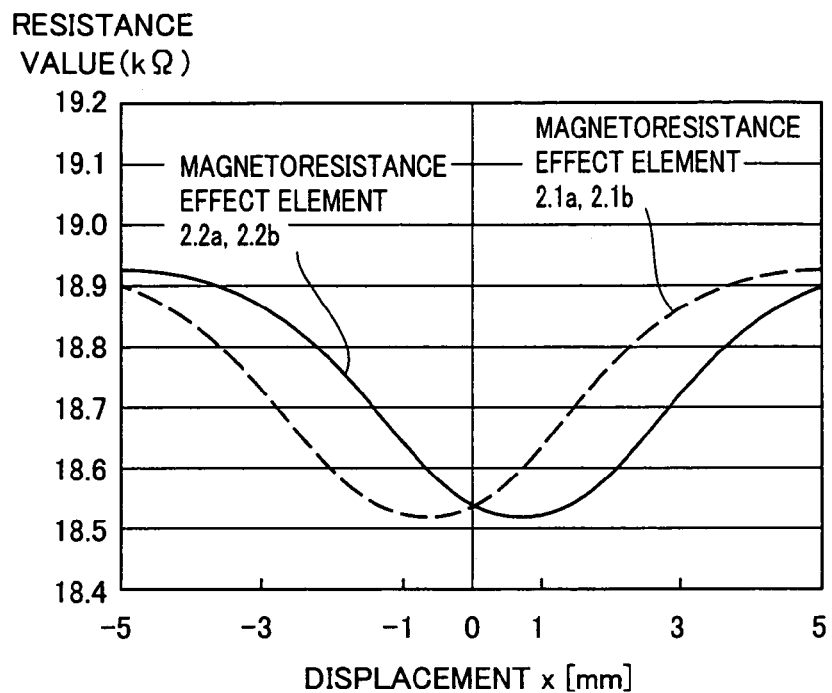
FIG. 31 is a diagram showing the relation between the displacement of a magnetic field generating unit and the resistance value of the magnetoresistance effect element.

FIG. 31 is a diagram showing the relation between the displacement of magnetic field generating unit 92 and the resistance values of magnetoresistance effect element pair 2.1a, 2.1b and magnetoresistance effect element pair 2.2a, 2.2b. The displacement of magnetic field generating unit 92 is positive rightward on the page from the center axis of bias unit 4 in FIG. 28.

Referring to FIG. 31, the resistance value of magnetoresistance effect element pair 2.1a, 2.1b assumes the minimum value in the case where the displacement of magnetic field generating unit 92 is negative, i.e. in the case where magnetic field generating unit 92 moves toward magnetoresistance effect elements 2.1a, 2.1b. On the other hand, the resistance value of magnetoresistance effect element pair 2.2a, 2.2b assumes the minimum value in the case where the displacement of magnetic field generating unit 92 is positive, i.e. in the case where magnetic field generating unit 92 moves toward magnetoresistance effect elements 2.2a, 2.2b.

With the displacement of magnetic field generating unit 92, therefore, different characteristics of the resistance value are developed between magnetoresistance effect element pair 2.1a, 2.1b and magnetoresistance effect element pair 2.2a, 2.2b. Detection circuit 56 thus detects the difference in resistance value using a bridge circuit.

Figure 32:
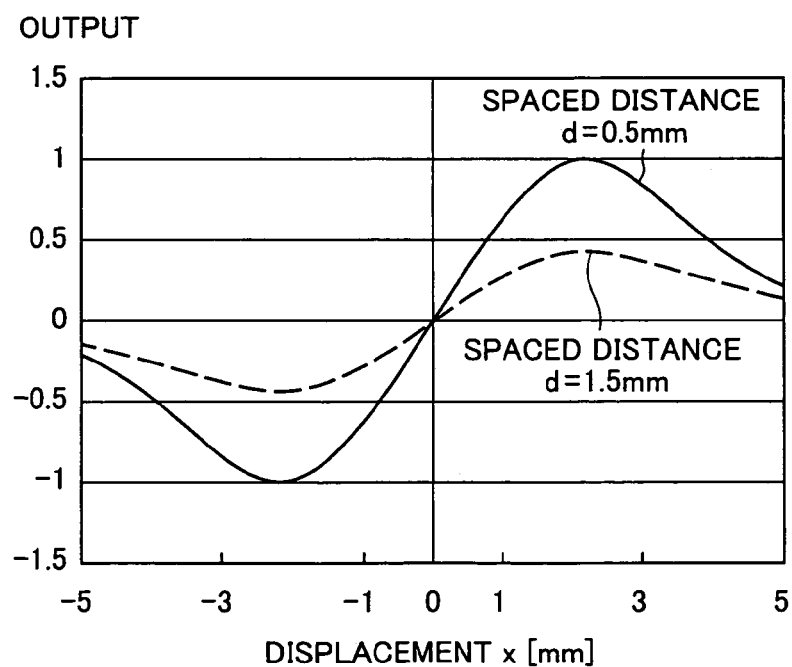
FIG. 32 is a diagram showing the relation between the displacement of the magnetic field generating unit and the detection signal output from the detection circuit.

FIG. 32 shows the relation between the displacement of magnetic field generating unit 92 and the detection signal output from detection circuit 56. The space distance d is the distance from magnetic field generating unit 92 to magnetoresistance effect elements 2.1a, 2.1b and 2.2a, 2.2b in FIG. 28.

Referring to FIG. 32, in the case where the displacement of magnetic field generating unit 92 is zero, i.e. in the case where magnetic field generating unit 92 is located on the extended center axis of bias unit 4, the resistance values of magnetoresistance effect element pair 2.1a, 2.1b and the resistance values of magnetoresistance effect element pair 2.2a, 2.2b coincide with each other, and therefore the bridge circuit is in equilibrium, resulting in the detection signal of zero. The detection signal increases or decreases in value in accordance with the displacement of the magnetic field generating unit 92.

The smaller the spaced distance d, the larger the variation (amplitude) of the detection signal. This is by reason of the fact that with the approach of magnetoresistance effect elements 2.1a, 2.1b and 2.2a, 2.2b to magnetic field generating unit 92, external magnetic field Hex generated from magnetic field generating unit 92 is more unbalanced.

As described above, magnetic field detection apparatus 600 can detect the displacement of magnetic field generating unit 92 added to mobile unit 90 adapted to move linearly in the direction perpendicular to the center axis of bias unit 4. The velocity as well as the displacement of magnetic field generating unit 92 at a given time point can be detected by counting the displacement variation in time domain.

Magnetic field generating unit 92 may be a magnet mounted on mobile unit 90, or a part of mobile unit 90 may be magnetized in the desired direction. Further, magnetic field generating unit 92 may be a gear-like protrusion formed on mobile unit 90 toward a detectable side of magnetic field detection apparatus 600.

Also, magnetic field detection apparatus 600 can detect a mobile unit adapted to rotate around the rotary axis thereof located on the extension of the center axis of bias unit 4, as well as mobile unit 90 in linear motion.

As long as external magnetic field Hex is not applied or magnetic field generating unit 92 is existent on the extension of the center axis of bias unit 4 as described above, the resistance values generated by magnetoresistance effect element pair 2.1a, 2.1b and magnetoresistance effect element pair 2.2a, 2.2b are desirably coincident with each other to maintain the bridge circuit in equilibrium. For this purpose, the position of bias unit 4 is required to be adjusted with respect to magnetoresistance effect element pair 2.1a, 2.1b and magnetoresistance effect element pair 2.2a, 2.2b.

Figure 33:
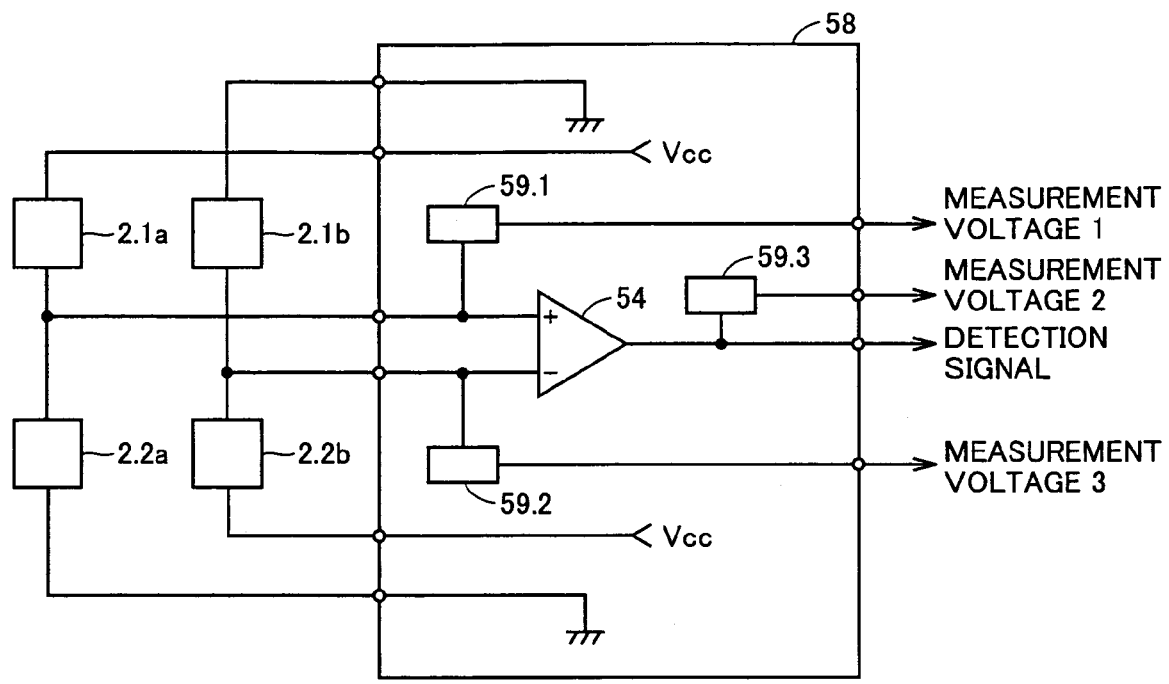
FIG. 33 is a diagram showing a schematic configuration of the detection circuit for adjusting the position of the bias unit.

Referring to FIG. 33, detection circuit 58 is equivalent to detection circuit 56 shown in FIG. 29 additionally including pad units 59.1, 59.2 and 59.3.

Pad units 59.1 and 59.2 are terminals for measuring the voltage input to preamplifier 54.

Pad unit 59.3 is a terminal for measuring the voltage output from preamplifier 54.

In adjusting the position of bias unit 4, the two voltages (measurement voltages 1 and 2) input to preamplifier 54 through pad units 59.1 and 59.2 are measured continuously without applying external magnetic field. While moving bias unit 4 simultaneously, the position is determined where the two voltages are coincident with each other.

As an alternative, the voltage (measurement voltage 3) output from preamplifier 54 is continuously measured through pad unit 59.3, while moving bias unit 4 simultaneously, and the position is determined where the particular voltage becomes zero.

Any mechanism may be employed as a method for moving bias unit 4. In order to realize a high detection accuracy, however, the interval per movement is desirably sufficiently small in accordance with the size of magnetoresistance effect elements 2.1a, 2.1b and 2.2a, 2.2b.

According to the sixth embodiment of the invention, the change in resistance value of two pairs of each two magnetoresistance effect elements arranged at different positions are detected by using a bridge circuit, and based on the resistance value change with time, the position of the magnetic field generating unit added to the mobile unit is detected. In this way, a magnetic field detection apparatus for detecting the position of a mobile unit without contact can be realized.

Also, according to the sixth embodiment of the invention, the bias unit is moved while measuring the voltage of the bridge circuit with no external magnetic field applied, and therefore the position of the bias unit where the bridge circuit is in equilibrium can be determined. As a result, a magnetic field detection apparatus small in detection error and high in detection accuracy is realized.

Seventh Embodiment

The sixth embodiment refers to a configuration capable of detecting the displacement of a mobile unit. The seventh embodiment, on the other hand, refers to a configuration for detecting both the displacement and the direction of displacement of a mobile unit.

Figure 34:
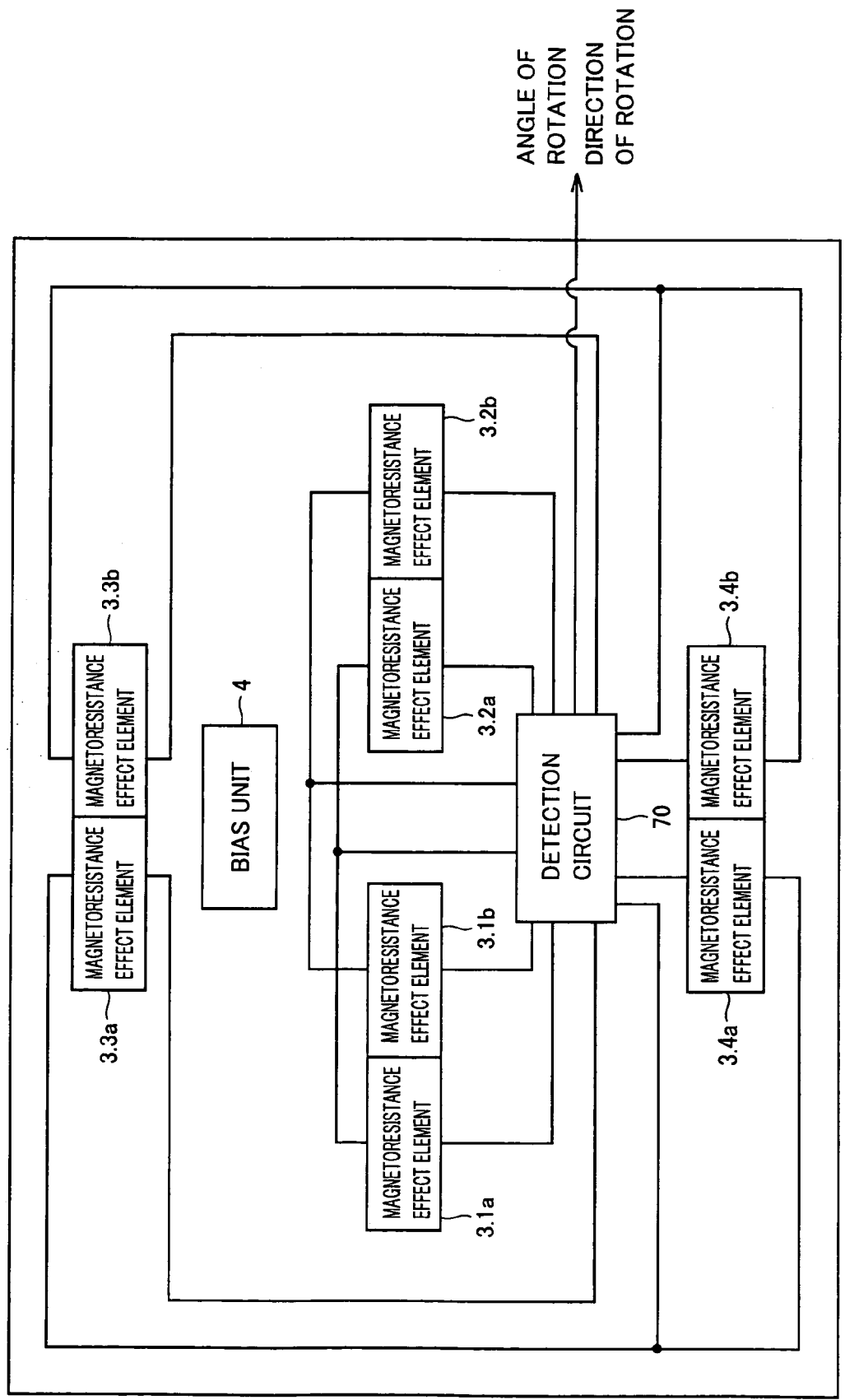
FIG. 34 is a diagram showing a schematic configuration of the magnetic field detection apparatus according to a seventh embodiment of the invention.

Referring to FIG. 34, a magnetic field detection apparatus 700 according to the seventh embodiment of the invention includes magnetoresistance effect elements 3.1a, 3.1b, 3.2a, 3.2b, 3.3a, 3.3b, 3.4a and 3.4b, a bias unit 4 and a detection circuit 70.

Magnetoresistance effect elements 3.1a, 3.1b, 3.2a and 3.2b have the same structure. Magnetoresistance effect elements 3.1a and 3.1b are arranged in proximity to each other, and so are magnetoresistance effect elements 3.2a and 3.2b. Therefore, the change in resistance value of magnetoresistance effect elements 3.1a and 3.1b under the effect of the external magnetic field and the bias magnetic field are equal to each other, and so are the change in resistance value of magnetoresistance effect elements 3.2a and 3.2b under the effect of the external magnetic field and the bias magnetic field.

Magnetoresistance effect elements 3.3a, 3.3b and 3.4a, 3.4b have the same structure. Magnetoresistance effect elements 3.3a and 3.3b are arranged in proximity to each other, and so are magnetoresistance effect elements 3.4a and 3.4b.

Magnetoresistance effect elements 3.4a and 3.4b receive a sufficiently large external magnetic field in a predetermined direction from bias unit 4, and therefore function as a reference resistor with a constant resistance value.

The other points of magnetoresistance effect elements 3.1a, 3.1b, 3.2a, 3.2b, 3.3a, 3.3b, 3.4a and 3.4b are similar to those of magnetoresistance effect element 2 according to the first embodiment and therefore detailed description will not be repeated here.

Detection circuit 70 makes up a bridge circuit including magnetoresistance effect elements 3.1a and 3.2a connected in series and magnetoresistance effect elements 3.1b and 3.2b connected in series, and detects the change in resistance value of each series circuit by differential operation of the respective resistance values. Further, detection circuit 70 constitutes a bridge circuit including magnetoresistance effect elements 3.3a and 3.4a connected in series and magnetoresistance effect elements 3.3b and 3.4b connected in series, and detects the change in resistance value of each series circuit by differential operation of the respective resistance values. Based on the change in resistance values thus detected, detection circuit 70 calculates and outputs the angle and direction of rotation.

Bias unit 4 applies a bias magnetic field to magnetoresistance effect elements 3.1a, 3.1b, 3.2a, 3.2b, 3.3a, 3.3b, 3.4a and 3.4b. The free layers of magnetoresistance effect elements 3.1a, 3.1b, 3.2a, 3.2b, 3.3a, 3.3b, 3.4a and 3.4b are saturated by the bias magnetic field received from the bias unit 4. The other points are similar to those of bias unit 4 according to the first embodiment and therefore detailed description will not be repeated here.

Figure 35:
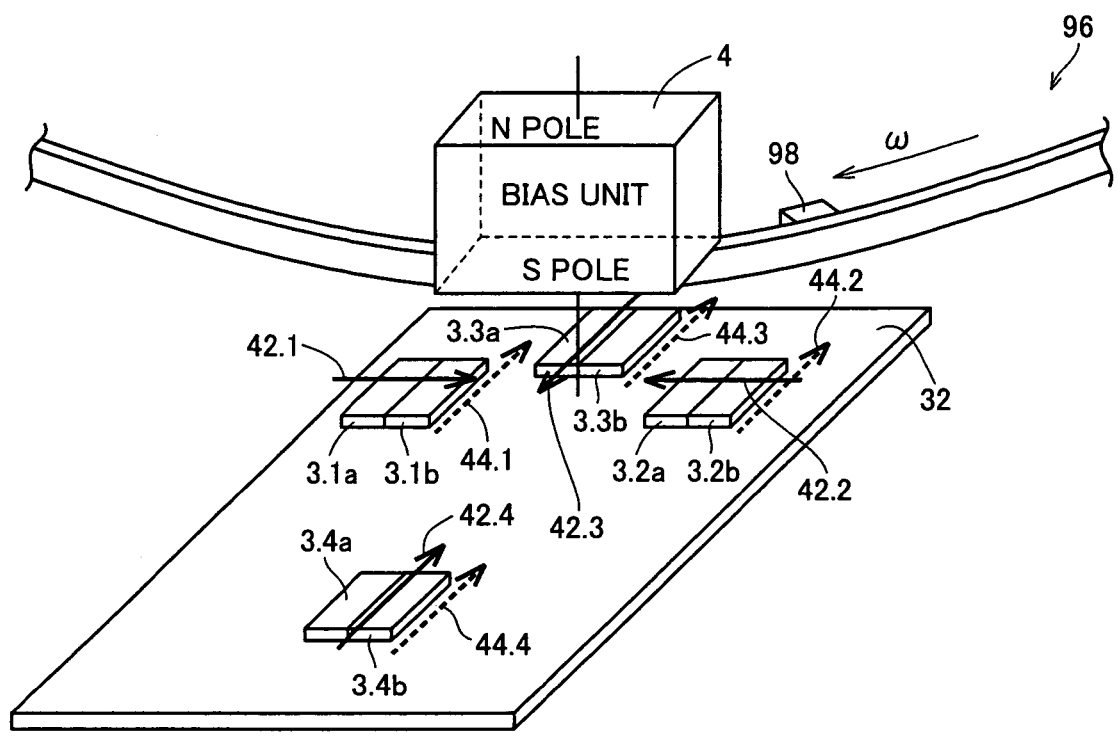
FIG. 35 is a diagram showing the substantial portion of the magnetic field detection apparatus according to the seventh embodiment of the invention.

Referring to FIG. 35, magnetic field detection apparatus 700 includes bias unit 4 arranged in predetermined spaced relation above a substrate 32, a pair of magnetoresistance effect elements 3.1a, 3.1b and a pair of magnetoresistance effect elements 3.2a, 3.2b arranged symmetrically about the center axis of bias unit 4 mapped on substrate 32, and a pair of magnetoresistance effect elements 3.3a, 3.3b and a pair of magnetoresistance effect elements 3.4a, 3.4b arranged along the center axis of bias unit 4 mapped on substrate 32. Magnetic field detection apparatus 700 detects the angle and direction of rotation of a mobile unit 96 rotated around a rotary axis (not shown) on the extension of the center axis of bias unit 4 mapped on substrate 32.

Specifically, magnetic field detection apparatus 700 detects the angle of rotation of a magnetic field generating unit 98 based on the difference in resistance value caused by the difference between the external magnetic field received by magnetoresistance effect elements 3.1a, 3.1b and the external magnetic field received by magnetoresistance effect elements 3.2a, 3.2b in accordance with the position of magnetic field generating unit 98 for generating external magnetic field Hex. Also, magnetic field detection apparatus 700 detects the angle of rotation of magnetic field generating unit 98 by differential operation of the resistance value of magnetoresistance effect elements 3.3a, 3.3b under the effect of the external magnetic field and the resistance value of magnetoresistance effect elements 3.4a, 3.4b remaining constant regardless of external magnetic field Hex in accordance with the position of the magnetic field generating unit 98 for generating external magnetic field Hex. Further, magnetic field detection apparatus 700 detects the direction of rotation of magnetic field generating unit 98 based on the two detection results.

Figure 36:
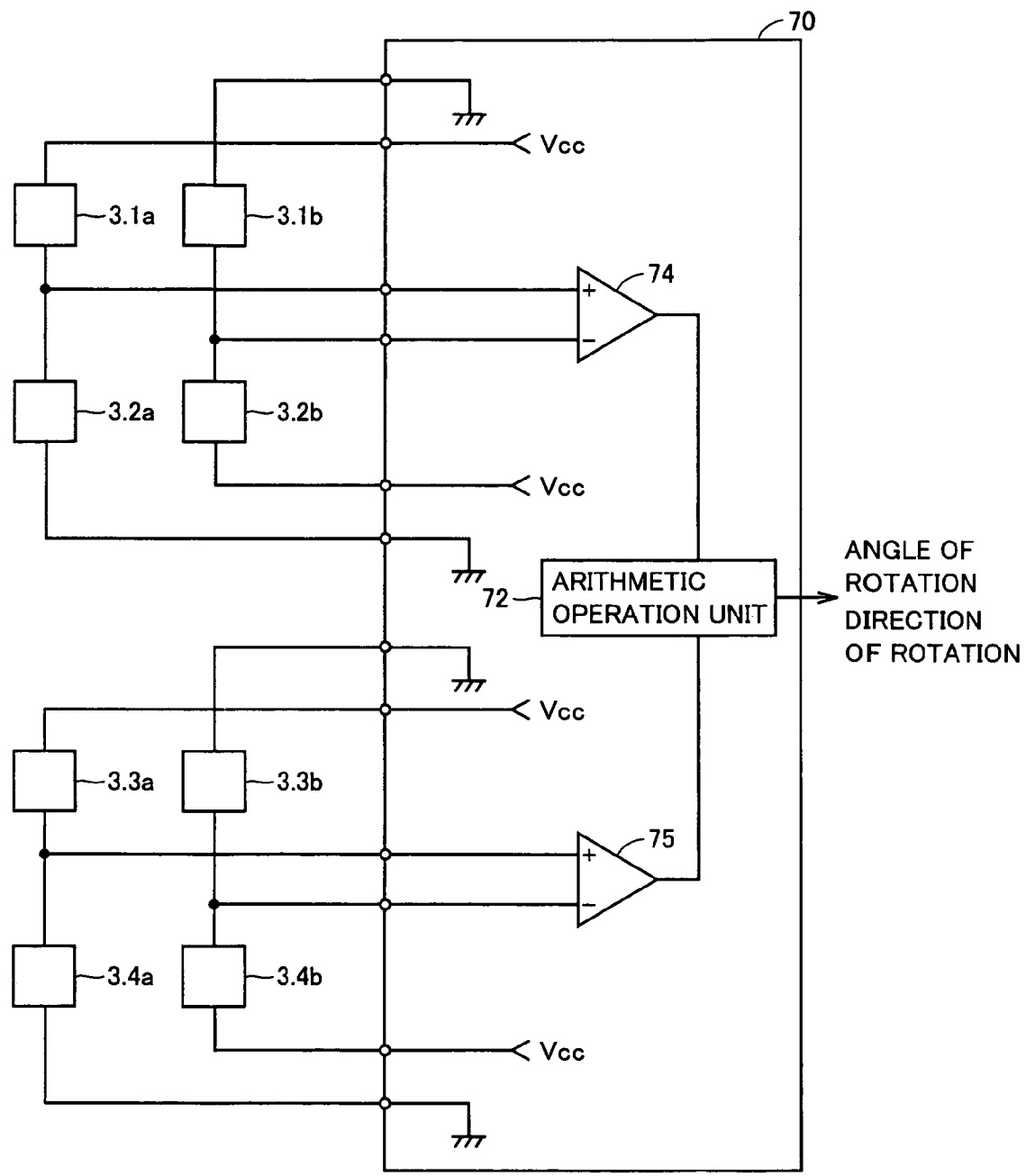
FIG. 36 is a diagram showing a schematic configuration of the detection circuit.

Referring to FIG. 36, detection circuit 70 detects the change in resistance value of magnetoresistance effect element pair 3.1a, 3.2a and magnetoresistance effect element pair 3.1b, 3.2b by a bridge circuit on the one hand and the change in resistance value of magnetoresistance effect element pair 3.3a, 3.3b and magnetoresistance effect element pair 3.4a, 3.4b on the other hand by a bridge circuit. Further, detection circuit 70 outputs the angle and direction of rotation. Detection circuit 70 includes preamplifiers 74 and 75 and an arithmetic operation unit 72.

An end of magnetoresistance effect element 3.1a is connected to an end of magnetoresistance effect element 3.2a. Further, the other end of magnetoresistance effect element 3.1a is impressed with a power supply voltage Vcc, while the other end of magnetoresistance effect element 3.2a impressed with the grounding voltage.

An end of magnetoresistance effect element 3.1b is connected to an end of magnetoresistance effect element 3.2b. Further, the other end of magnetoresistance effect element 3.2b is impressed with a power supply voltage Vcc, while the other end of magnetoresistance effect element 3.1b impressed with the grounding voltage.

Preamplifier 74 amplifies, with a predetermined amplification factor, the potential difference between the potential at the connection point of magnetoresistance effect elements 3.1a, 3.2a and the potential at the connection point of magnetoresistance effect elements 3.1b, 3.2b and outputs the amplified voltage to arithmetic operation unit 72.

An end of magnetoresistance effect element 3.3a is connected to an end of magnetoresistance effect element 3.4a. Further, the other end of magnetoresistance effect element 3.3a is impressed with a power supply voltage Vcc, while the other end of magnetoresistance effect element 3.4a is impressed with the grounding voltage.

An end of magnetoresistance effect element 3.3b is connected to an end of magnetoresistance effect element 3.4b. Further, the other end of magnetoresistance effect element 3.4b is impressed with a power supply voltage Vcc, while the other end of magnetoresistance effect element 3.3b is impressed with the grounding voltage.

Preamplifier 75 amplifies, with a predetermined amplification factor, the potential difference between the potential at the connection point of magnetoresistance effect elements 3.3a, 3.4a and the potential at the connection point of magnetoresistance effect elements 3.3b, 3.4b, and outputs the amplified voltage to arithmetic operation unit 72.

Arithmetic operation unit 72, in response to the voltage signal output from preamplifier 74 and the voltage signal output from preamplifier 75, calculates and outputs the angle and direction of rotation.

Figure 37:
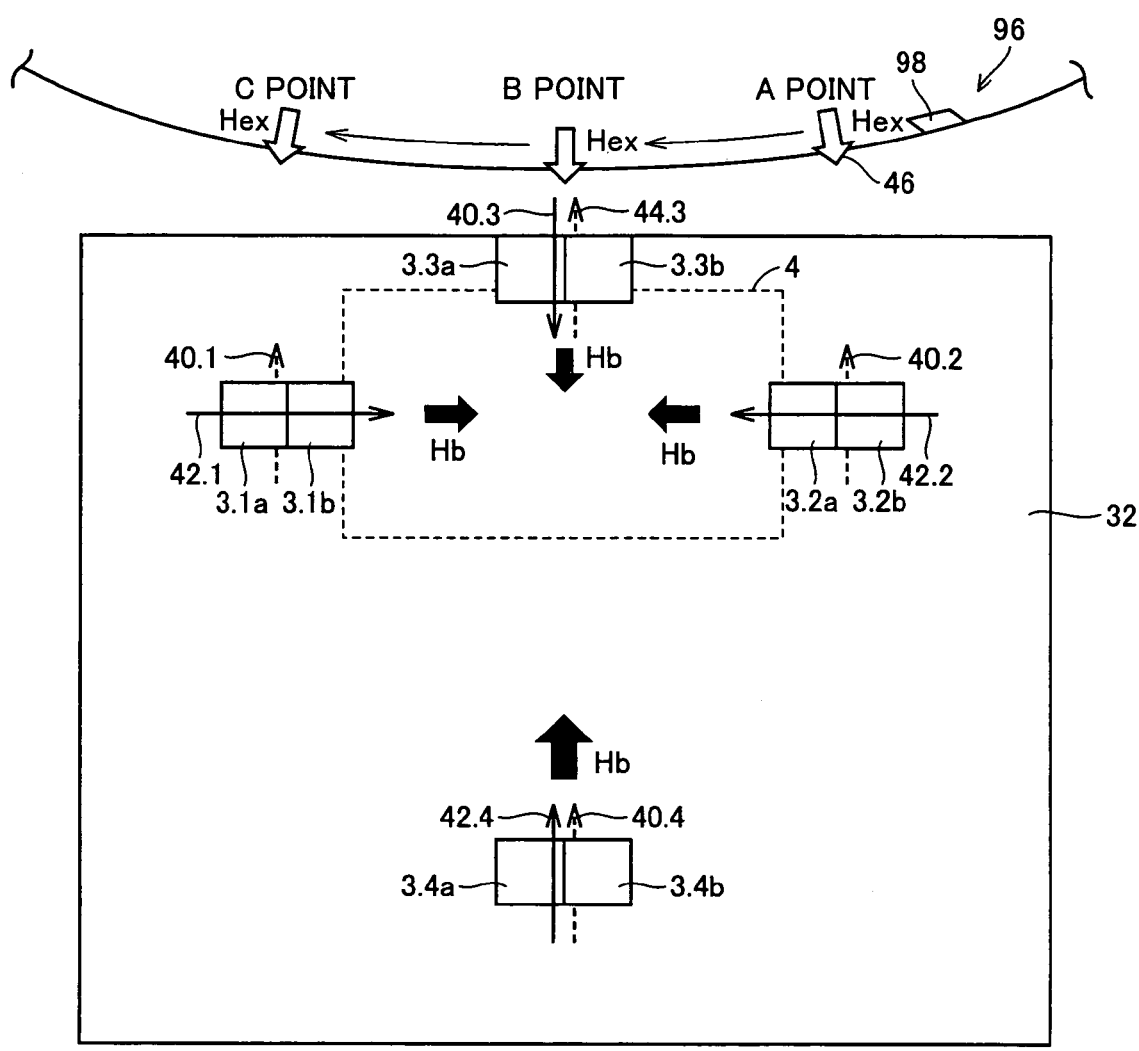
FIG. 37 is a diagram for explaining the external magnetic field and the bias magnetic field applied to the magnetoresistance effect element of the magnetic field detection apparatus according to the seventh embodiment of the invention.

Referring to FIG. 37, the distance between magnetoresistance effect elements 3.1a and 3.1b is sufficiently smaller than the distance from magnetoresistance effect elements 3.1a, 3.2b to bias unit 4 and mobile unit 96. Therefore, bias magnetic field Hb and external magnetic field Hex are considered to have an equal effect on magnetoresistance effect elements 3.1a, 3.1b. This is also the case with the other magnetoresistance effect elements. Thus, magnetoresistance effect elements 3.2a, 3.2b, magnetoresistance effect elements 3.3a, 3.3b and magnetoresistance effect elements 3.4a, 3.4b can each be regarded as a pair of equivalent magnetoresistance effect elements, respectively.

In magnetoresistance effect elements 3.1a, 3.1b, magnetized vector 40.1 of the pinned layer is fixed in the direction parallel to the center axis of bias unit 4 mapped on substrate 32, and magnetized vector 42.1 of the free layer is set at an angle corresponding to external magnetic field Hex and bias magnetic field Hb. In similar fashion, in magnetoresistance effect elements 3.2a, 3.2b, magnetized vector 40.2 of the pinned layer is fixed in the direction parallel to the center axis of bias unit 4 mapped on substrate 32, and magnetized vector 42.2 of the free layer is set at an angle corresponding to external magnetic field Hex and bias magnetic field Hb. In the process, substantially the free layers of magnetoresistance effect elements 3.1a, 3.1b and 3.2a, 3.2b are fully magnetized in the direction of magnetized vectors 42.1 and 42.2 respectively, and in saturated state.

Also, magnetoresistance effect element pair 3.1a, 3.1b and magnetoresistance effect element pair 3.2a, 3.2b are arranged symmetrically with respect to each other about the center axis of bias unit 4 mapped on substrate 32. Bias magnetic fields Hb applied to magnetoresistance effect element pair 3.1a, 3.1b and magnetoresistance effect element pair 3.2a, 3.2b are symmetrical about the center axis of bias unit 4 mapped on substrate 32. Unless external magnetic field Hex is applied, therefore, the angle that magnetized vector 40.1 of the pinned layer forms with magnetized vector 42.1 of the free layer in magnetoresistance effect elements 3.1a, 3.1b coincides with the angle that magnetized vector 40.2 of the pinned layer forms with magnetized vector 42.2 of the free layer in magnetoresistance effect elements 3.2a, 3.2b.

Next, upon application of external magnetic field Hex to magnetoresistance effect elements 3.1a, 3.1b and 3.2a, 3.2b, magnetized vectors 42.1 and 42.2 of the free layers change in direction.

As a result, the output voltage of the bridge circuit configured of magnetoresistance effect elements 3.1a, 3.1b and 3.2a, 3.2b detected by detection circuit 70 is substantially similar to the output voltage of the bridge circuit of magnetic field detection apparatus 600 according to the sixth embodiment.

In magnetoresistance effect elements 3.3a, 3.3b, on the other hand, magnetized vector 40.3 of the pinned layer is fixed in the direction parallel to the center axis of bias unit 4 mapped on substrate 32, while magnetized vector 42.3 of the free layer is reversed in direction in accordance with external magnetic field Hex and bias magnetic field Hb. Also, in magnetoresistance effect elements 3.4a, 3.4b, magnetized vectors 40.4 of the pinned layer is fixed in the direction parallel to the center axis of bias unit 4 mapped on substrate 32, while magnetized vector 42.4 of the free layer is fixed in the direction of bias magnetic field Hb and not affected by external magnetic field Hex.

Specifically, the direction of magnetization of magnetoresistance effect elements 3.3a, 3.3b are reversed alternately in accordance with the rotational angle of magnetic field generating unit 98, resulting in a great change of the resistance value. Magnetoresistance effect elements 3.4a, 3.4b, on the other hand, are not affected by external magnetic field Hex and therefore have a constant resistance value regardless of the position of magnetic field generating unit 98, thereby functioning as a reference resistor. In this way, a predetermined bias magnetic field is applied to magnetoresistance effect elements 3.4a, 3.4b to function as a reference resistor. In the case where a bridge circuit is configured of magnetoresistance effect elements 3.3a, 3.3b and 3.4a, 3.4b, therefore, the temperature dependency of each resistance value can be offset. As a result, an error due to the temperature factor is suppressed.

Figure 38A:
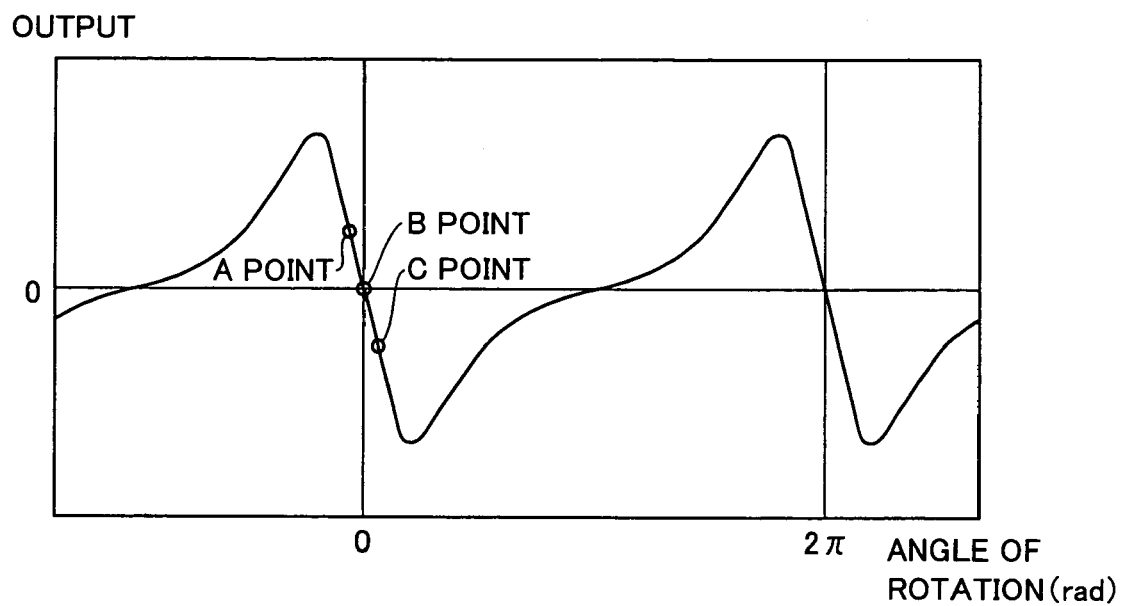
FIGS. 38A and 38B are diagrams showing the relation between the rotation angle of the magnetic field generating unit and the voltage signal in the detection circuit.

FIG. 38A shows a voltage signal output from a bridge circuit configured of magnetoresistance effect elements 3.1a, 3.1b and 3.2a, 3.2b.

Figure 38B:
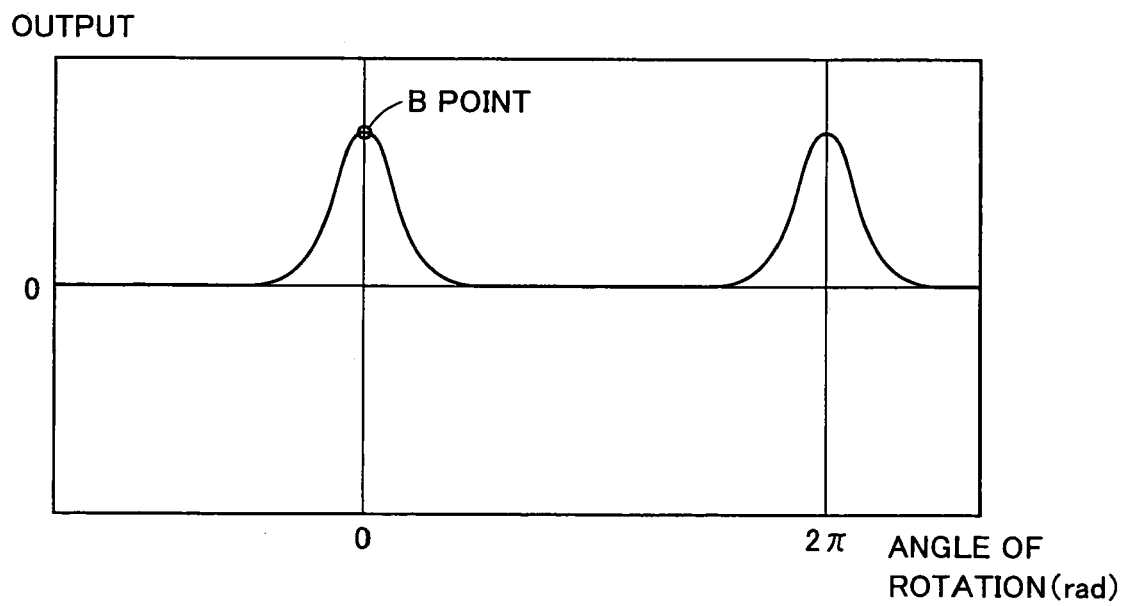
Figure 39:
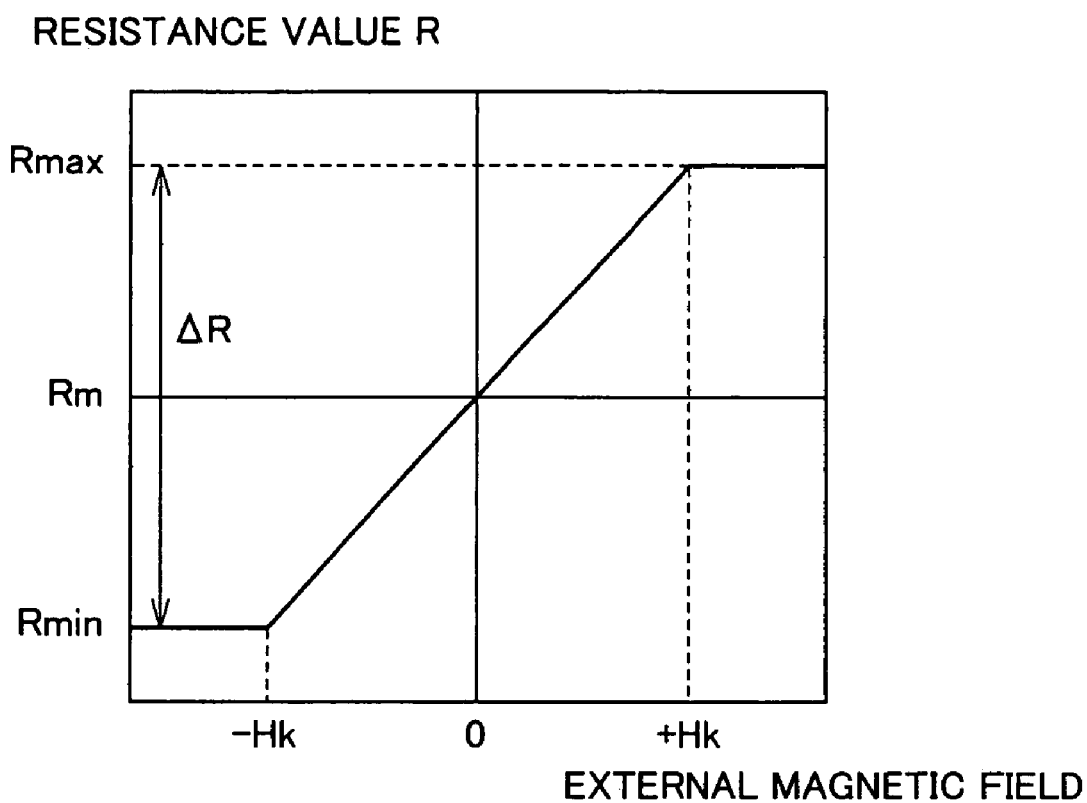
FIG. 39 is a schematic diagram showing the relation between the external magnetic field and the resistance value of the magnetoresistance effect element having the spin valve structure.

FIG. 38B shows a voltage signal output from a bridge circuit configured of magnetoresistance effect elements 3.3a, 3.3b and 3.4a, 3.4b.

Referring to FIGS. 37 and 38A, in the case where magnetic field generating unit 98 is located at B point, i.e. on the center axis of bias unit 4 mapped on substrate 32, the resistance values of magnetoresistance effect element pair 3.1a, 3.1b and magnetoresistance effect element pair 3.2a, 3.2b coincide with each other. Thus, the bridge circuit enters an equilibrium and the voltage signal is reduced to zero. In the case where magnetic field generating unit 98 is located at A point, i.e. on the side of magnetoresistance effect elements 3.2a, 3.2b, on the other hand, the resistance value of magnetoresistance effect element pair 3.2a, 3.2b is reduced, and the voltage signal increases to positive side. Further, in the case where magnetic field generating unit 98 is located at C point, i.e. on the side of magnetoresistance effect elements 3.1a, 3.1b, the resistance value of magnetoresistance effect element pair 3.1a, 3.1b decreases, and the voltage signal is reduced to negative side. As described above, the voltage signal of the bridge circuit configured of magnetoresistance effect elements 3.1a, 3.1b and 3.2a, 3.2b is periodically changed with the rotation of magnetic field generating unit 98.

Referring to FIGS. 37 and 38B, in the case where magnetic field generating unit 98 is located at B point, i.e. on the center axis of bias unit 4 mapped on substrate 32, the direction of magnetization of the free layers of magnetoresistance effect elements 3.3a, 3.3b is reversed, and therefore the resistance value undergoes a great change so that the voltage signal assumes a local maximum value. Once magnetic field generating unit 98 is separated considerably from magnetoresistance effect elements 3.3a, 3.3b, the direction of magnetization of the free layers can no longer be maintained in reversed state. Therefore, the bridge circuit enters an equilibrium, and the voltage signal is reduced to zero.

As described above, the voltage signal of the bridge circuit configured of magnetoresistance effect elements 3.3a, 3.3b and 3.4a, 3.4b is periodically changed with the rotation of magnetic field generating unit 98.

Referring to FIGS. 38A and 38B, arithmetic operation unit 82 (FIG. 36) of detection circuit 70 is supplied with a voltage signal of the bridge circuit configured of magnetoresistance effect elements 3.1a, 3.1b and 3.2a, 3.2b and calculates the rotational angle of magnetic field generating unit 98. Further, arithmetic operation unit 72 of detection circuit 70 calculates the direction of rotation of magnetic field generating unit 98 by comparing the voltage signal from the bridge circuit configured of magnetoresistance effect elements 3.1a, 3.1b and 3.2a, 3.2b with the voltage signal from the bridge circuit configured of magnetoresistance effect elements 3.3a, 3.3b and 3.4a, 3.4b.

With the time point at which the voltage signal from the bridge circuit configured of magnetoresistance effect elements 3.3a, 3.3b and 3.4a, 3.4b assumes a local maximum value as a reference time, for example, the polarity of the subsequent voltage signals from the bridge circuit configured of magnetoresistance effect elements 3.1a, 3.1b and 3.2a, 3.2b is determined thereby to determine the rotational direction. Specifically, in the case where the voltage signal from the bridge circuit configured of magnetoresistance effect elements 3.1a, 3.1b and 3.2a, 3.2b is positive at and after the time point when the voltage signal from the bridge circuit configured of magnetoresistance effect elements 3.3a, 3.3b and 3.4a, 3.4b assumes a local maximum value, then the rotation is determined in the direction from B to A point, while in the case where the voltage signal is negative, on the other hand, the rotation is determined in the direction toward C point from B point.

Magnetic field generating unit 98 may be configured of a magnet mounted on mobile unit 96. Alternatively, a part of mobile unit 96 may be magnetized in the desired direction. Further, magnetic field generating unit 98 may be a gear-like protrusion formed on mobile unit 96 toward the detectable side of magnetic field detection apparatus 700.

The foregoing description refers to a case in which the angle and direction of rotation of the mobile unit in rotation are detected as an example of the displacement and the direction of displacement of the mobile unit. Nevertheless, the displacement and the direction of displacement of a mobile unit in linear motion can of course be detected as an alternative.

According to the seventh embodiment of the invention, the change in resistance value of two pairs of each two magnetoresistance effect elements arranged at different positions are detected by using a bridge circuit and further the change in resistance value of another two pairs of each two magnetoresistance effect elements arranged at different positions are detected by using a bridge circuit. Based on the change with the time detected by the two bridge circuits, the angle and direction of rotation of the mobile unit can be detected. As a result, a magnetic field detection apparatus is realized in which the displacement and the direction of displacement of a mobile unit are detected contactlessly.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A magnetic field detection apparatus, comprising:
a magnetoresistance effect element including a first ferromagnetic layer and a second ferromagnetic layer stacked with a first nonmagnetic layer interposed therebetween, a first conductive wire attached to a top surface of the second ferromagnetic layer, where the top surface of the second ferromagnetic layer is a surface that does not contact the first nonmagnetic layer, and a second conductive wire attached to a portion on a surface of the first ferromagnetic layer that does not contact the first nonmagnetic layer; and
a detection circuit configured to detect an external magnetic field applied to the magnetoresistance effect element, based on the resistance value of the magnetoresistance effect element, the detection circuit includes a portion thereof arranged on a substrate shared by the magnetoresistance effect elements wherein
the direction of magnetization of the first ferromagnetic layer is fixed regardless of the external magnetic field,
the direction of magnetization of the second ferromagnetic layer is configured to change with the external magnetic field,
the magnetoresistance effect element is configured to change in resistance value in accordance with the correlation between the directions of magnetization of the first and second ferromagnetic layers,
the magnetic field detection apparatus further includes a bias unit configured to apply a bias magnetic field to the magnetoresistance effect element and to change a characteristic of the resistance value of the magnetoresistance effect element to the external magnetic field,
the magnetic field detection apparatus detects the external magnetic field generated by a mobile unit adapted to move and approach first and second positions, and includes a first magnetoresistance effect element of said magnetoresistance effect element and a second magnetoresistance effect element of said magnetoresistance effect element arranged at the first position, and a third magnetoresistance effect element of said magnetoresistance effect element and a fourth magnetoresistance effect element of said magnetoresistance effect element arranged at the second position,
the first and second magnetoresistance effect elements and the third and fourth magnetoresistance effect elements are arranged in such a manner that each direction of magnetization of the first ferromagnetic layer is the same as the direction of the external magnetic field, the bias unit for the first, second, third and fourth magnetoresistance effect element is arranged so that the magnitude of the bias magnetic fields at the first and second positions substantially coincide with each other, the detection circuit constitutes a first bridge circuit having the first and second magnetoresistance effect elements as one pair of opposite sides and the third and fourth magnetoresistance effect elements as the other pair of opposites sides, and the external magnetic field is detected based on the potential difference between opposite points of the first bridge circuit caused by the difference in resistance value between the pair of the first and second magnetoresistance effect elements and the pair of the third and fourth magnetoresistance effect elements with the movement of the mobile unit.

2. The magnetic field detection apparatus according to claim 1, further comprising a fifth and a sixth magnetoresistance effect elements arranged at third positions on a straight line orthogonally crossing a line segment, at a middle point thereof, connecting the first and second positions and adapted to be approached by the mobile unit in motion, wherein the detection circuit further includes two reference resistors substantially constant in resistance value regardless of the external magnetic field, and constitutes a second bridge circuit with the fifth and sixth magnetoresistance effect elements constituting one pair of opposite sides and the two reference resistors constituting the other pair of opposite sides, and the displacement and the direction of displacement of the external magnetic field are detected based on the change with the time of the potential difference between opposite points of the first bridge circuit and the change with the time of the potential difference between opposite points of the second bridge circuit caused by the movement of the mobile unit.

3. The magnetic field detection apparatus according to claim 2, wherein the two reference resistors include two magnetoresistance effect elements that are applied a substantially constant bias magnetic field regardless of the external magnetic field.

4. The magnetic field detection apparatus according to claim 1, wherein the bias unit is arranged on a straight line containing a middle point of a line segment connecting the first and second positions and parallel to the direction of magnetization of the first ferromagnetic layer.

5. The magnetic field detection apparatus according to claim 1, wherein the first and second magnetoresistance effect elements and the third and fourth magnetoresistance effect elements are arranged on a same substrate, the bias unit is arranged in a plane parallel to and spaced by a predetermined distance from the substrate, and the center axis of the bias unit mapped on the substrate coincides with a straight line containing a middle point of a line segment connecting the first and second positions and parallel to the direction of magnetization of the first ferromagnetic layer.

6. The magnetic field detection apparatus according to claim 1, wherein the detection circuit further includes a pad unit configured to measure at least selected one of the potentials of opposite points and the potential difference between opposite points of the first bridge circuit.

* * * * *